United States Patent
Noe

(10) Patent No.: US 7,373,454 B1
(45) Date of Patent: May 13, 2008

(54) PATTERN DETECT AND BYTE ALIGN CIRCUIT USING CAM

(75) Inventor: Amanda Noe, Plano, TX (US)

(73) Assignee: Altera Corporation, San Jose, CA (US)

( * ) Notice: Subject to any disclaimer, the term of this patent is extended or adjusted under 35 U.S.C. 154(b) by 175 days.

(21) Appl. No.: 10/695,976

(22) Filed: Oct. 28, 2003

(51) Int. Cl.
  G06F 12/00 (2006.01)
(52) U.S. Cl. ...................................... 711/108
(58) Field of Classification Search ............... None
  See application file for complete search history.

(56) References Cited

U.S. PATENT DOCUMENTS

| | | | |
|---|---|---|---|
| 5,010,516 A * | 4/1991 | Oates ........................... 365/49 |
| 5,652,878 A * | 7/1997 | Craft ............................. 707/1 |
| 6,160,419 A | 12/2000 | Veenstra et al. |
| 6,490,650 B1 * | 12/2002 | Pereira ........................ 711/108 |
| 6,728,492 B1 | 4/2004 | Baroncelli |
| 6,747,886 B1 * | 6/2004 | Morikawa ..................... 365/49 |
| 6,919,736 B1 * | 7/2005 | Agrawal et al. .............. 326/41 |
| 2002/0159483 A1 * | 10/2002 | Clauberg ..................... 370/503 |

* cited by examiner

Primary Examiner—Hyung S. Sough
Assistant Examiner—Craig E Walter
(74) Attorney, Agent, or Firm—Townsend and Townsend and Crew LLP

(57) ABSTRACT

A method detects a programmable pattern (e.g., Ethernet comma or SONET A1A2 frame) and simultaneously byte aligns to that pattern. The technique uses a content addressable memory (CAM) programmed (e.g., selected by the user) with a particular pattern to enable detecting of a symbol or symbols, or pattern, of bits in an incoming serial stream. The circuitry deserializes the serial stream and byte aligns parallel data based on output from the CAM and a state machine.

27 Claims, 26 Drawing Sheets

A1A2 framer and byte alignment circuit

Actual CAM table for 20-bit bus

FIGURE 13

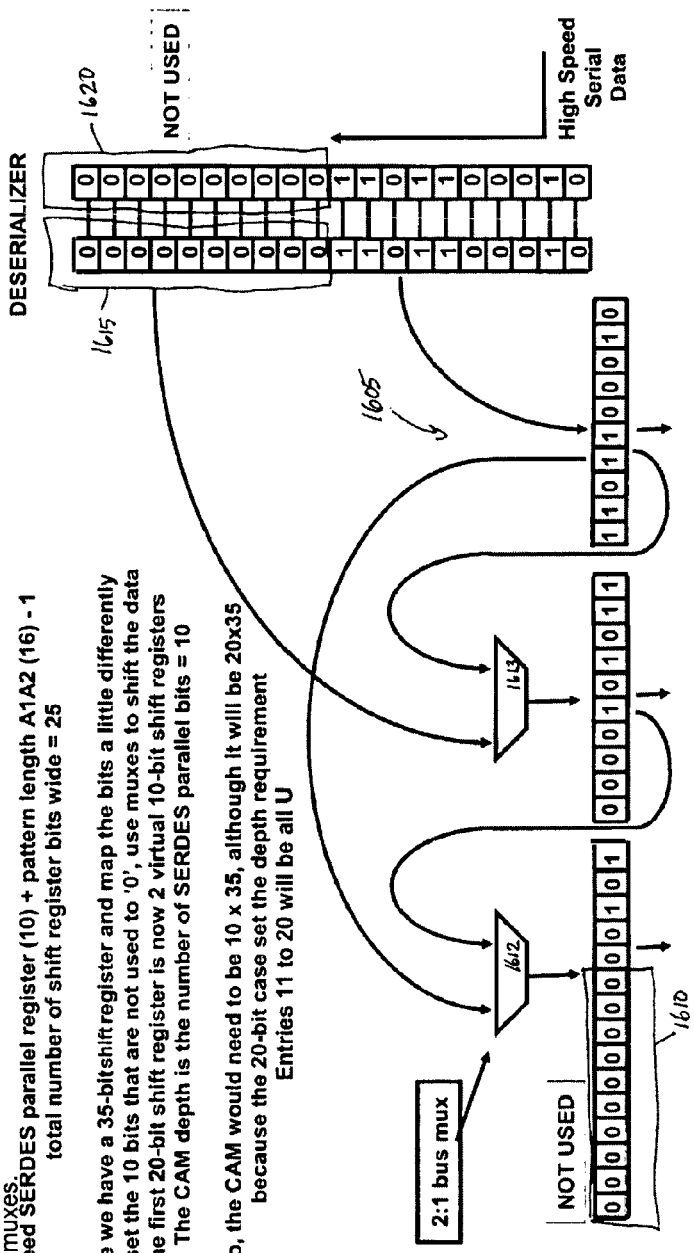

Extending idea to 10-bit bus

- This slide shows how data would map from the serial to parallel converter to the shift register and into the CAM for a 10-bit parallel data SERDES.

We will assume that the CAM size has already been set by the 20-bit bus width case and so we will use muxes as shown below for the 10-bit bus width case. Alternatively, we could have increased the size of the CAM to eliminate the need for the muxes.
    Need SERDES parallel register (10) + pattern length A1A2 (16) - 1
    total number of shift register bits wide = 25

Here we have a 35-bit shift register and map the bits a little differently
    We set the 10 bits that are not used to '0', use muxes to shift the data
    The first 20-bit shift register is now 2 virtual 10-bit shift registers
    The CAM depth is the number of SERDES parallel bits = 10

So, the CAM would need to be 10 x 35, although it will be 20x35 because the 20-bit case set the depth requirement
    Entries 11 to 20 will be all U

FIGURE 16

CAM Table for matching multiple F6's followed by multiple 28's for a 20-bit bus width When matching a SONET framing pattern F6F62828, the state machine would look for two consecutive matches in the top half of the table followed by two corresponding consecutive matches in the bottom half of the table.

Figure 20

CAM Table for matching multiple F6's followed by multiple 28's for a 16-bit bus width When matching a SONET framing pattern F6F62828, the state machine would look for two consecutive matches in the top half of the table followed by two corresponding consecutive matches in the bottom half of the table.

Figure 21

CAM Table for matching multiple F6's followed by multiple 28's for a 10-bit bus width When matching a SONET framing pattern F6F62828, the state machine would look for two consecutive matches in the top half of the table followed by two corresponding consecutive matches in the bottom half of the table.

Figure 22

CAM Table for matching multiple F6's followed by multiple 28's for a 8-bit bus width

When matching a SONET framing pattern F6F62828, the state machine would look for two consecutive matches in the top half of the table followed by two corresponding consecutive matches in the bottom half of the table.

Figure 23

CAM Table for matching comma characters K28.5- (negative disparity) and K28.5+ (positive disparity) for a 20-bit bus width

Figure 24

Figure 25: CAM Table for matching comma characters K28.5- (negative disparity) and K28.5+ (positive disparity) for a 10-bit bus width

*AAA is the code that selects the right tri_state buffers based upon the CAM Match Flags

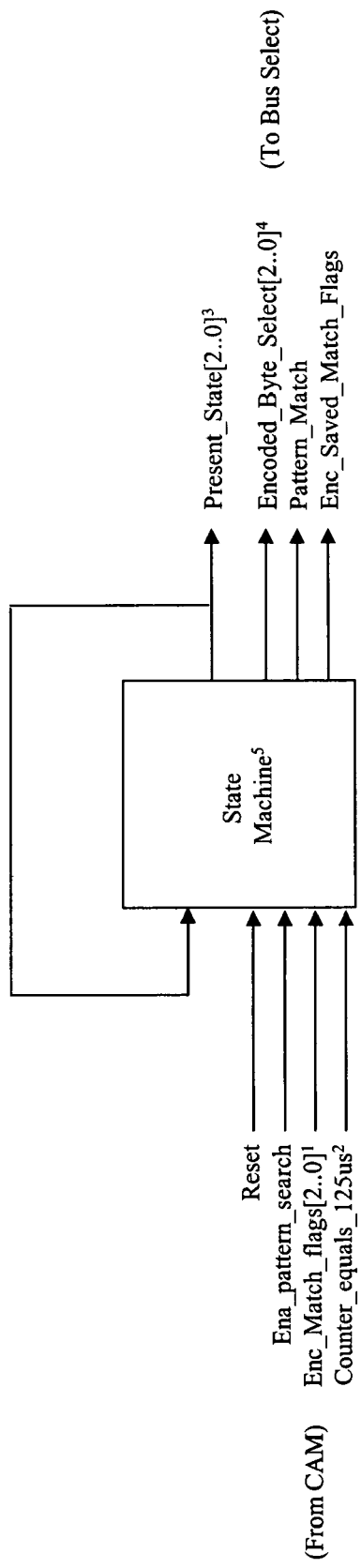

Figure 27

[1]Number of bits will increase to support the binary encoding of the number of CAM table entries.
[2]There is a separate counter that will count to 125 us that is used for framing.
[3]Number of state bits will be determined by the largest number of programmable states that are required to accommodate all desired state machines.
[4]Number of encoded bytes select bits will increase to support a larger bus width.

PATTERN DETECT AND BYTE ALIGN CIRCUIT USING CAM

BACKGROUND OF THE INVENTION

The present invention relates to the field of programmable integrated circuits and in particular, to techniques and circuitry for implementing a pattern detection and data alignment mechanism in a programmable logic device.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded user-programmable memory or RAM.

Despite the success of programmable logic, there is a continuing desire to provide greater functionality in a programmable logic integrated circuit, but at the same time, provide greater performance. Desired functionalities include high speed serial interfaces. These interfaces are needed especially as data and communications interfaces.

Data is transferred serially through a network. When serial data is input into an integrated circuit, the data is converted into parallel form for further processing and handling. However, when converting serial data into parallel form, it is important to form the parallel bits from the serial data using the correct byte or word boundaries. For example, the most significant bit (MSB) and least significant bit (LSB) of a byte of data should be in the correct positions of the byte of data. The byte of parallel data needs to be aligned properly from the serial stream. Once converted in a proper parallel data format with correct byte or word alignment, the integrated circuit, such as a programmable logic integrated circuit, may process the data.

In data transmission, there is typically a symbol or symbols (or pattern) that is used to denote the beginning of a frame boundary or some other unique symbol such as an idle character which can be used to achieve byte alignment. It is desirable to provide a technique to recognize or identify the symbol and align the serial data properly as rapidly and efficiently as possible, even though it may not be aligned within the parallel byte of data coming from a deserializer. As with circuitry for integrated circuits, the circuitry used to implement the approach should be area efficient.

Furthermore, the symbol or symbols for different serial or networking protocols are different or may change. It is costly to replace a "type A" integrated circuit with a "type B" integrated circuit to address different symbols. It is also costly to manufacture several types of integrated circuits where the only difference is the circuitry used to recognize a symbol and adhere to a particular protocol. Therefore, it is desirable to have one type integrated circuit which may be programmed or reprogrammed to recognize any symbol or a range of different symbols, so this integrated circuit may be used with different serial transfer or networking protocols. It is important that the circuitry used to implement the technique may be programmed, reprogrammed, altered, or changed easily, without a major change such as a mask change, in order to recognize different symbols and achieve byte or word alignment.

Therefore, there is a need to provide techniques and circuitry for implementing a serial-to-parallel conversion with pattern detect and byte alignment, especially as an input interface for programmable logic.

BRIEF SUMMARY OF THE INVENTION

The invention provides a method to detect a programmable pattern (e.g., Ethernet comma or SONET A1A2 frame pattern) and simultaneously byte align to that pattern. The technique uses a content addressable memory (CAM) programmed (e.g., selected by the user) with a particular pattern to enable detecting of a symbol or symbols, or pattern, of bits in an incoming serial stream. The circuitry deserializes the serial stream and byte aligns parallel data based on output from the CAM and a state machine.

In an embodiment, the invention is a programmable logic integrated circuit with on-chip pattern detect and byte alignment circuitry. A user will have flexibility in the state machine of the circuitry (e.g., to determine what pattern to detect) and also allow the user to select what to do once a pattern is detected as well. This circuit offers the benefits of a built-in feature (i.e., deserialization and byte alignment) yet still provides programmability and flexibility (i.e., select the symbol or pattern to detect).

A feature of the technique of invention is that the circuit can detect any programmable pattern that can be contained in the CAM locations and is not limited to just these predefined common patterns like Ethernet commas or SONET frame sequences.

In an embodiment, the invention is a method including receiving a serial stream of data bits; deserializing the serial stream of data bits into parallel bits; inputting the parallel bits into a content addressable memory and a first register; inputting an output of the first register into a second register; inputting outputs of the first and second registers to the content addressable memory; providing the parallel bits in a plurality of parallel bit output formats; and selecting one of the parallel bit output formats to output based on match flag outputs from the content addressable memory, wherein the match flag outputs are generated in response to the inputs to the content addressable memory.

In another embodiment, the invention is a circuit including a deserializer circuit coupled to receive serial data input and outputting a first parallel data of output. The circuit further includes a shift register coupled to the first parallel data output and a content addressable memory, coupled to the shift register to receive the first parallel data output in parallel.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 13 shows an example of the contents of the CA4M for detecting the A1A2 (F628) pattern for a 20 bit bus width.

FIG. 16 shows a circuit implementation for a 10-bit bus width).

FIG. 20 shows an example of the contents of the CAM for detecting A1A1A2A2(F6F62828) for a 20-bit bus width.

FIG. 21 shows an example of the contents of the CAM for detecting A1A1A2A2(F6F62828) for a 16-bit bus width.

FIG. 22 shows an example of the contents of the CAM for detecting A1A1A2A2(F6F62828) for a 10-bit bus width.

FIG. 23 shows an example of the contents of the CAM for detecting A1A1A2A2(F6F62828) for an 8-bit bus width.

FIG. 24 shows an example of detecting the comma character K28.5− (negative disparity) and K28.5+ (positive disparity) for a 20-bit bus width.

FIG. 25 shows an example of detecting K28.5− and K28.5+ for a 10-bit bus width.

FIG. 27 shows a state machine, implemented in an ESB of a PLD, of the invention.

DETAILED DESCRIPTION OF THE INVENTION

Figure 1:
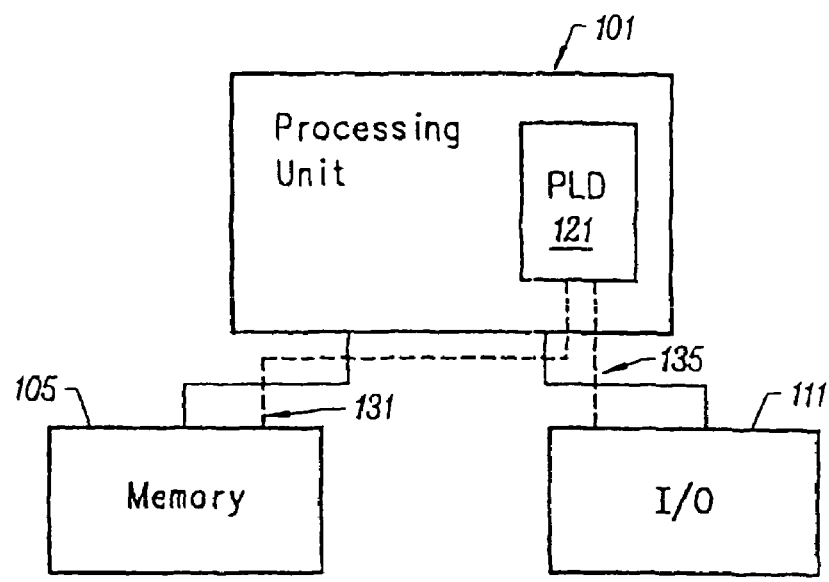
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs and are sold, for example, by Altera Corporation of San Jose, Calif. Programmable logic integrated circuits and their operation are well known to those of skill in the art.

In the particular embodiment of FIG. 1, a processing unit 101 is coupled to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
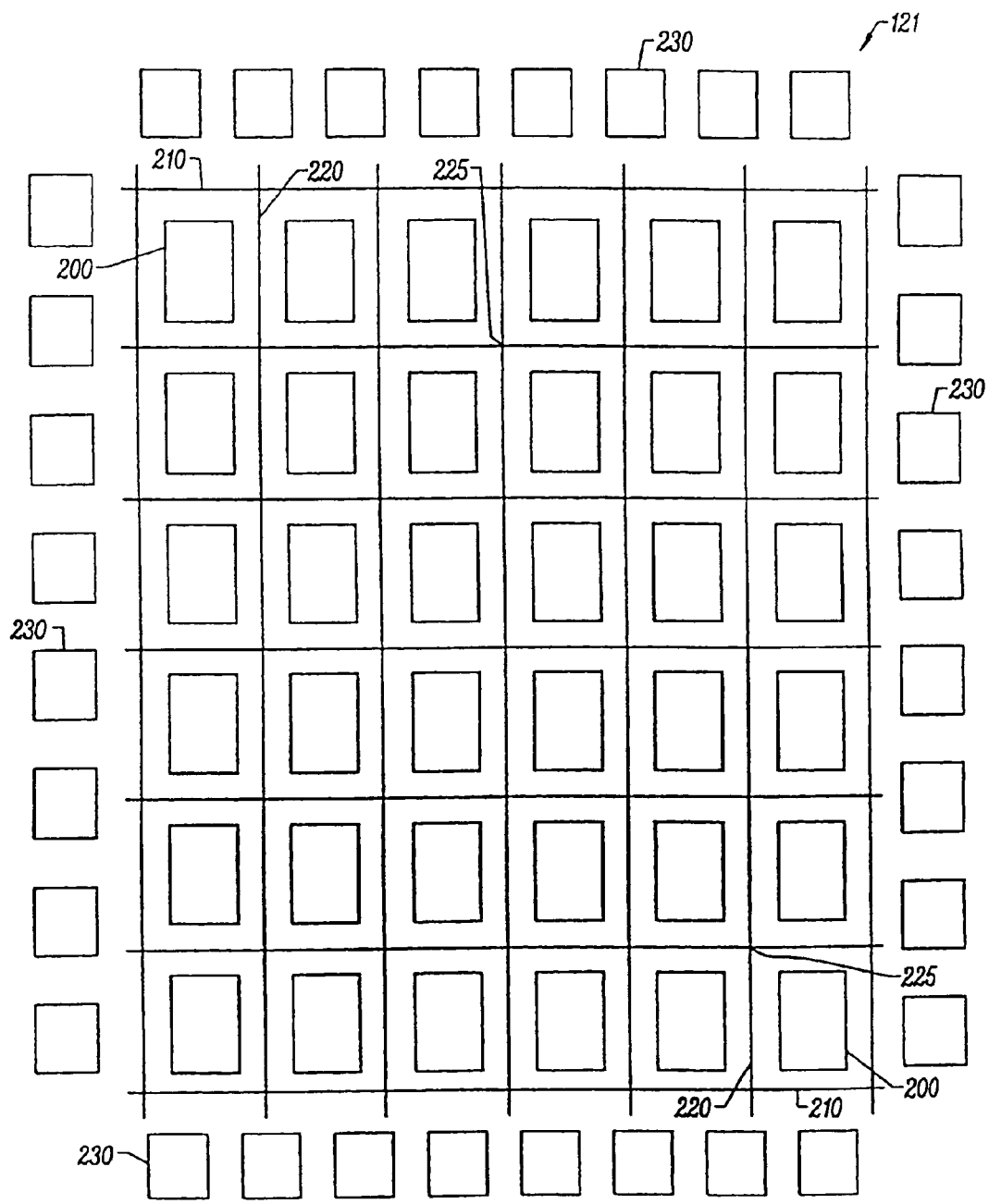
FIG. 2 is a diagram showing a floor plan of a programmable logic integrated circuit with an embedded processor.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of horizontal interconnects 210 and vertical interconnects 220. Although shown as single lines in FIG. 2, each set of interconnect lines may represent a plurality of signal conductors. The inputs and outputs of LAB 200 are programmably connectable to these sets of interconnect lines, such that multiple LABs 200 may be connected and combined to implement larger, more complex logic functions than can be realized using a single LAB 200.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
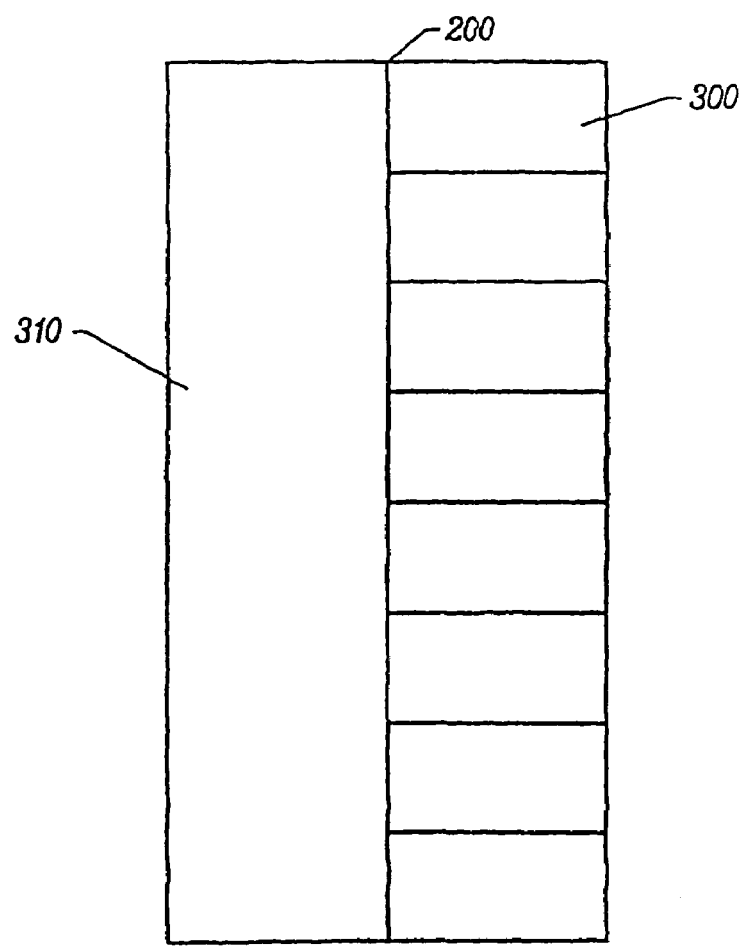
FIG. 3 is a diagram showing the programmable logic portion of the programmable logic integrated circuit.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB are connectable to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the interconnect lines 210 and 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure.

Figure 4:
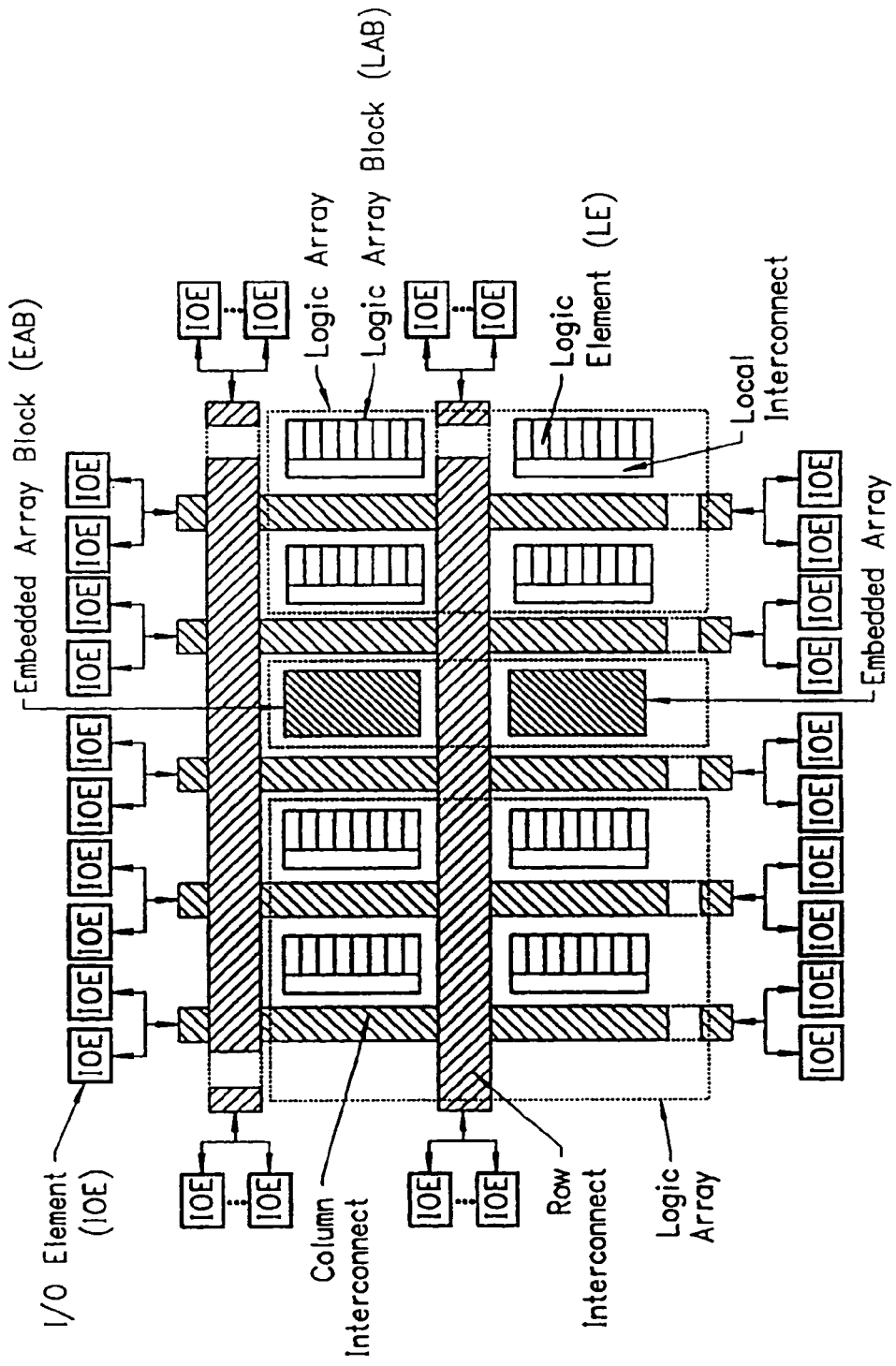
FIG. 4 is a simplified block diagram of a logic array block (LAB).

FIG. 4 shows a programmable logic architecture. The architecture in FIG. 4 further includes embedded array blocks (EABs). EABs contain user memory, a flexible block of RAM. Some or all of the input/output elements may be consistent with embodiments of the present invention. The embedded array blocks can be configured as FIFOs acting as frequency translators and serial to parallel converters for interfacing between high-speed input and outputs and the core circuits including the logic array blocks.

Generally, PLDs have arrays of logic connectable to arrays of interconnect and IO regions, which are used to interact between chip core and external devices. In addition, hard blocks, including memories and multipliers, have been added to PLDs to further improve performance and functionality.

Programmable logic integrated circuits are used to interface with serial data such as that transmitted using SONET or over an Ethernet. A specific embodiment of the invention is circuitry to determine the frame boundaries of incoming serial data such as SONET and Ethernet data for programmable logic, and align this data for further processing within the integrated circuit. The invention is also applicable to other types of integrated circuits including gate arrays, ASICs, microprocessors, memories, and others. The circuitry of the invention may be implemented using the programmable logic of a programmable logic integrated circuit, such as using an intellectual property core, or may be physically implemented in the silicon in an integrated circuit. For example, the circuitry of the present invention may be incorporated in the integrated circuit of FIG. 4.

Figure 5:
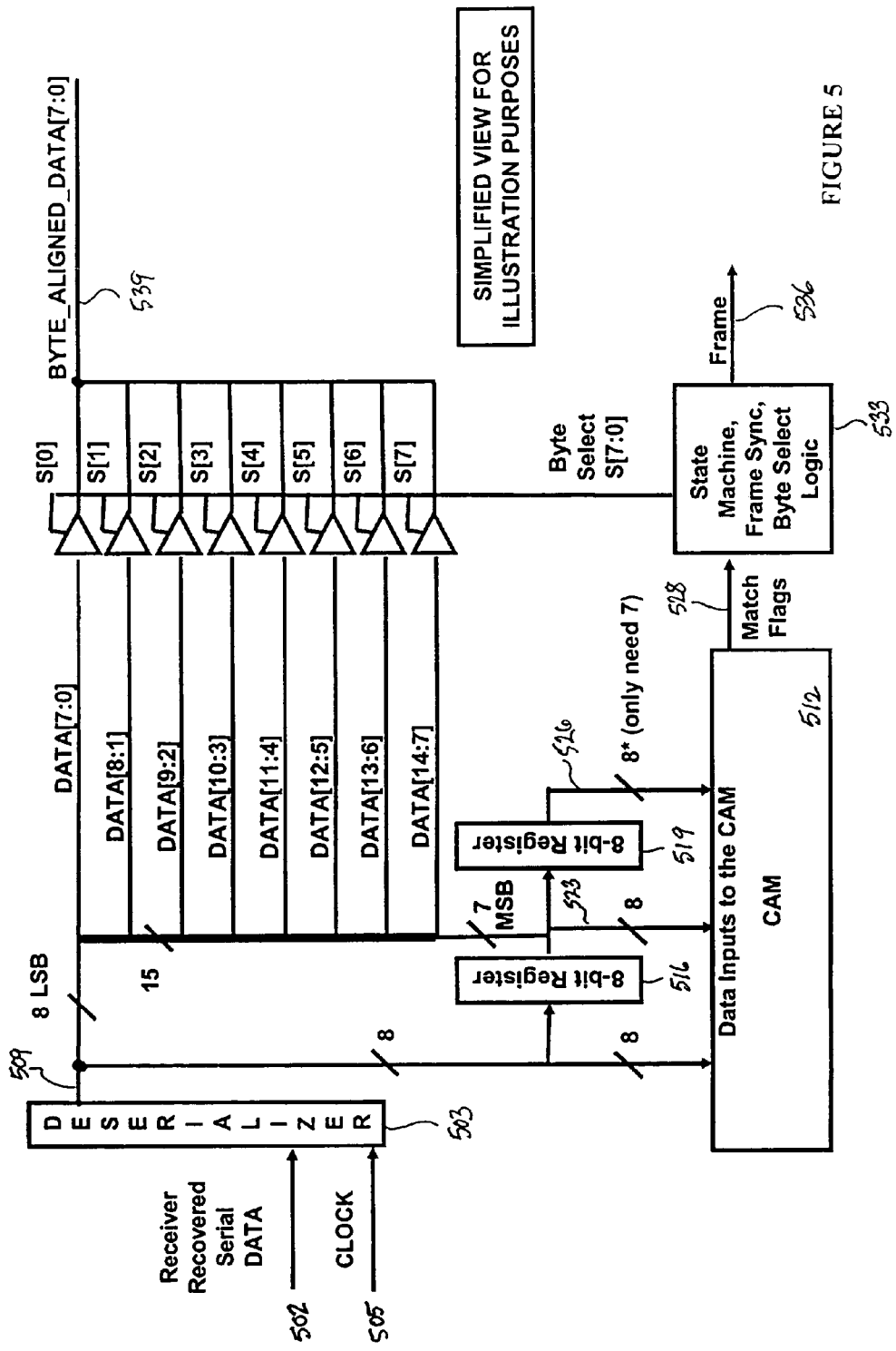
FIG. 5 shows a block diagram of circuitry of the invention to byte align incoming 8-bit serial data transmitted using SONET.

FIG. 5 shows a block diagram of circuitry of the invention to byte align incoming 8-bit serial data transmitted using SONET. This figure shows a simplified view for illustration purposes. This specific embodiment is for the SONET protocol and is merely one example of the invention. This circuit may be referred to as a A1A2 framer and byte alignment circuit.

In other embodiments, other types of serial data transmission protocols such as Ethernet may be used, and the invention would operate in a similar manner. In SONET, the frame boundaries are denoted by an F6 (hexadecimal) followed by a 28 (hexadecimal) transmission of bits. The circuitry determines where the frame boundaries are and aligns the incoming data to this frame boundary, so the integrated circuit may process bytes of the data. In other protocols, different sequences of bits may be used to denote the byte, word, packet or frame boundaries and the circuitry of the invention may be altered or adjusted as needed to look for these different sequences.

Serial data is shifted into a deserializer at input 502. This data denoted as receiver recovered serial data is connected to deserializer 503. This input is typically connected to an output from an input buffer receiving data from one of the pins of the integrated circuit. The clock at input 505 also inputs into the deserializer. The clock may have been recovered from the data using clock data recovery or it may be an input to the device or internal clock. The frequency of the clock at clock input 505 will typically be at the same rate as the data. For example, the data may be input at 622 Megabits per second, and the clock will be at 622 Megahertz. In this particular example, the parallel bus size or byte size at output 509 is 8 bits. However, the parallel bus width at 509 could be 8 bits, 10 bits, 16 bits, 20 bits or any other width.

The deserializer deserializes the data to convert the serial data into parallel data at its output 509. The deserialized data then gets registered at 516. The output of the register 523 gets combined with the parallel data at 509 to become a wider bus at 510. At this point a byte align function is performed on the parallel data which involves changing the positions of the individual bits in the bus.

A traditional method of performing byte alignment uses a barrel shifter. Another method is to use a multiplier which can be SRAM based. This approach uses tristate buffers which are capable of driving a logic '1', a logic '0', or high impedance. Once a particular subset of the wider bus is selected as the particular subset that achieves alignment, the tristate buffers for that group will drive data continuously until a different byte alignment is selected.

Referring back to FIG. 5, groups of eight bits of the bus at 510 are connected to eight tristate buffers in eight different formats: DATA[7:0], DATA[8:1], DATA[9:2], DATA[10:3], DATA[11:4], DATA[12:5], DATA[13:6], and DATA[14:7]. The group of DATA [15:8] is not required because this group; would have the same byte alignment as DATA [7:0], just delayed by one parallel clock cycle. The bus feeding the DATA wires is 15 bits wide. Each of the DATA connections are connected to a tristate buffer. Each tristate buffer has an output S[0], S[1], S[2], S[3], S[4], S[5], S[6], and S[7].

Eight bits from the deserializer are connected to a content addressable memory (CAM) 512 and two 8-bit shift registers 516 and 519. Eight bits 523 from the first shift register 516, delayed after a clock cycle, are input to the CAM. Eight bits 526 from the second shift register 519, delayed after another clock cycle, are input to the CAM. However, for bits 526, only seven of the eight bits are needed. In other implementation, there may be more than two shift registers, such as three, four, five, six, or more. Or there may be fewer than two shift registers, such as one. The number of shift registers depends on factors such as the number of bits of the pattern and the parallel bus width.

The CAM outputs a number of match flags 528, which are input to a state machine 533 eight byte select signal outputs S[7:0], each of which is connected to a respective control input of one of the eight tristate buffers. The state machine contains logic to synchronize the frame or symbol and select the proper byte boundaries. The state machine also has a symbol detect or frame pattern detect signal output 536.

The tristate buffers connected to DATA[7:0] are controlled by S[0]. The tristate buffers connected to DATA[8:1] are controlled by S[1]. The tristate buffers connected to DATA[9:2] are controlled by S[2]. The tristate buffers connected to DATA[10:3] are controlled by S[3]. The tristate buffers connected to DATA[11:4] are controlled by S[4]. The tristate buffers connected to DATA[12:5] are controlled by S[5]. The tristate buffers connected to DATA[13:6] are controlled by S[6]. The tristate buffers connected to DATA [14:7] are controlled by S[7].

Based on the byte select signals S[7:0], one of the tristate buffer groups will be enabled and the rest will be disabled, so one set of the DATA lines will be output as byte or frame aligned data [7:0] 539. The tristate buffers controlled by S[7:0] function as a multiplexer to select which of the DATA inputs to pass through to output bus 539. Other circuitry, besides the specific implementation using tristate buffers shown in the figure, may be used to implement this multiplexing function. For example, barrel shifters, multipliers, logic gates or a crosspoint switch may be used to implement this multiplexing function instead.

The circuitry is used for the symbol detection and byte alignment blocks in, for example, a hard silicon receiver portion of a programmable logic integrated circuit. The circuitry is an alternative to a barrel shifter circuit. It can be easily adapted to do symbol detection and byte alignment for many different protocol standards by loading different symbol patterns into the CAM and different state machine logic into a programmable state machine such as a product term (P-term) state machine on power-up. This circuit uses SONET A1A2 framing at 622 using the parallel byte width of 8 bits (at 78 Megahertz) as an example, but can be extended to XAUI and Gigabit Ethernet for example having deserializers 20-bits wide or wider and higher data rates, especially as technology advances and performance improves.

The circuit includes a serial-to-parallel converter in a SERDES block, a shift register, a CAM, a state machine implemented as a customized p-term enhanced system block (ESB), a counter, and a tristate bus. This first example shows the serial to parallel converter as an 8-bit parallel register in the SERDES block, but the real register may be 20 bits where the upper bits 9 through 20 are not used for parallel data. The mapping to different parallel bus widths is shown after this example.

This example also assumes that the search pattern for framing is an A1-to-A2 transition, where A1 is "11110110" in binary or "F6" in hex, and A2 is "00101000" in binary or "28" in hex. It is important to note that the SONET standard does not preclude the "F628" pattern from appearing as a data sequence in the payload so there is a chance of "false framing" on the wrong "F628." The real frame pattern will repeat every 125 microseconds so the state machine will be used to find frame.

How the circuit would work is that on power up, the serial-to-parallel converter would be receiving serial bits at any random place in the SONET frame. The bits would be clocked into bytes by the low speed clock as is typically the situation for a SERDES receiver. The bytes would not necessarily be byte aligned coming from the SERDES. The parallel data would then be shifted through two additional shift register stages in the parallel domain. At each clock cycle in the low speed clock domain, a new byte of data gets shifted in and the third byte of data gets shifted out and whole bytes are shifted at a time. The shift register bits are connected to a CAM input data bus and the CAM will report (1) if the frame pattern is found by having any match flag become true, and (2) where the start of the byte boundary is by the exact flag that is true.

The match flags will feed a state machine. In an embodiment, the state machine is binary encoded to keep the number of state machine inputs small. For example, in a programmable logic integrated circuit, the state machine may be implemented as a programmable state machine such as an ESB in p-term mode or ROM which allows the software to program in a different state machine for a different protocol (e.g., Ethernet comma detect).

Figure 26:
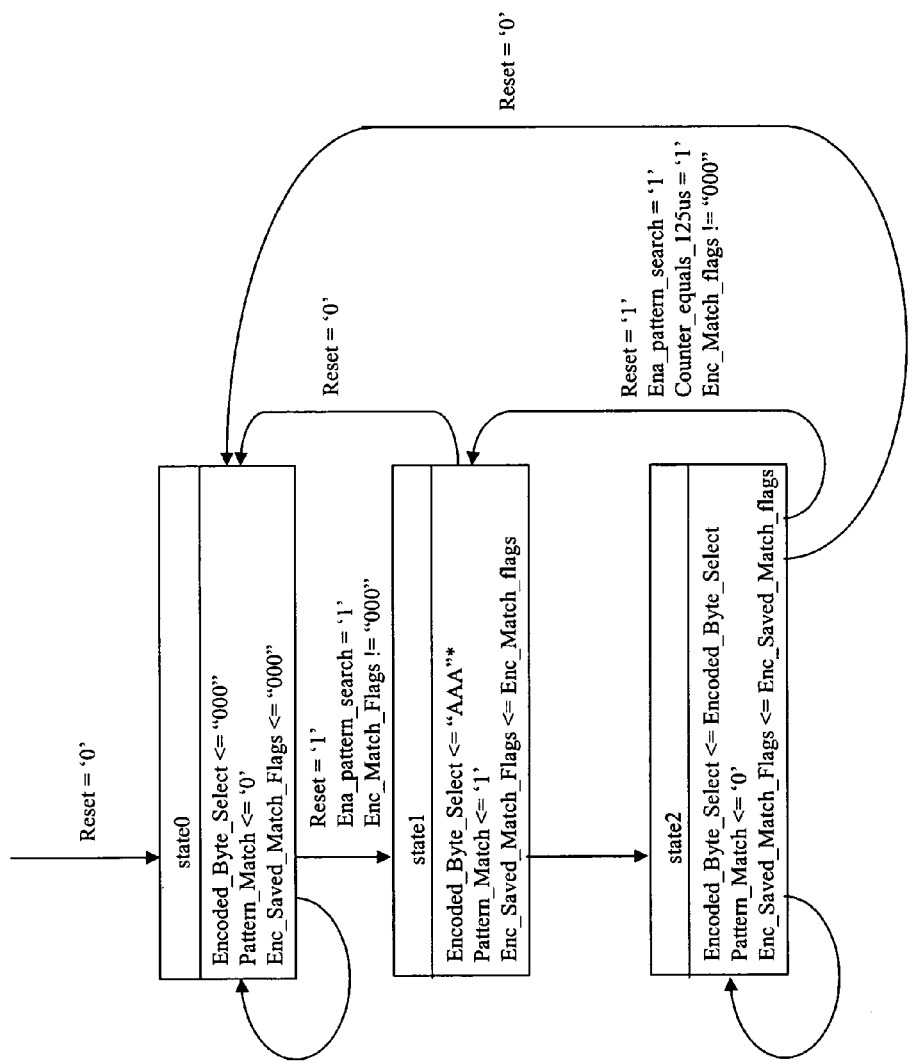
FIG. 26 shows a state flow diagram to implement a technique of the invention.

FIG. 26 shows a state flow diagram. FIG. 27 shows a representative ESB that would be used to implement the state flow diagram in FIG. 26. The state transitions shown in FIG. 26 represent the basic functionality required for detecting the frame pattern and producing the match flags.

In the state flow diagram, there are three states, state 0, state 1, and state 2. Upon reset (reset=0), the system will be placed into state 0. The reset signal may be issued upon or after start up of the system, or simple to reset the system to state 0. If the conditions are such reset is 1 (true), ena_pattern_search is 1 (true), and enc_match_flags are not "000," the system will proceed to state 1 from state 0. Otherwise, the system will remain in state 0. Condition or flag ena_pattern_search is true when the system is set up to allow pattern search, and false (or 0) or it is not. A user can decide when to enable searching in this system.

From state 1, processing will continue to state 2, as long as reset is not 0. "AAA" is the code that selects the right tristate buffers based upon the CAM match flags. From state 2, processing will stay within state 2 unless reset is 0, or ena_attern_search is 1, counter_equals_125 us is 1, and enc_match_flags is not "000."

In an embodiment of the invention, it may be desirable to declare a frame by detecting two or three, or more, consecutive A1 s followed immediately by two or three, or more, A2s as in STS-48, for example. If this sequence is needed or required, then the CAM would change where the first entries would be the possible byte positions of "F6" and the second set of entries would be the possible byte positions of "28." The state machine would look for these consecutive states "F6 F6 F6 28 28 28." So by this, one can see that we need to determine all major symbol types we want to support and have an appropriate size CAM to support all of them. FIGS. 20, 21, 22 and 23 show example CAM tables for bit widths of 20-bits, 16-bits, 10-bits and 8-bits consecutively.

The invention may be extended or mapped to other protocols such as Ethernet comma detect or any other standard where it is desirable to frame and byte-align. In this case, the CAM table for detecting the comma characters K28.5+ and K28.5− are shown in FIG. 24 and FIG. 25 consecutively for a 20-bit bus width and 10-bit bus width.

Figure 6:
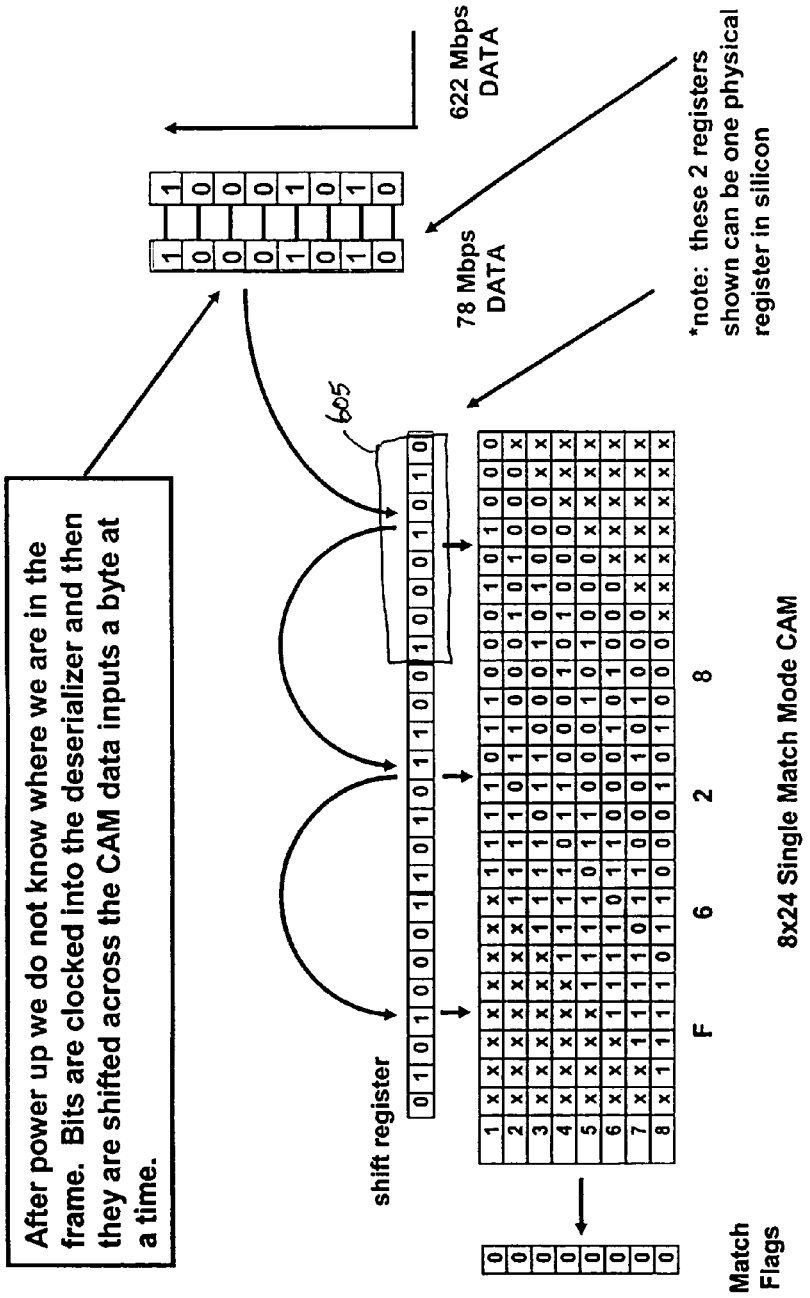
FIG. 6 shows an example operation of the circuitry.

FIG. 6 shows an example operation of the circuitry. After power up, we do not know where we are in the frame. Bits are clocked into the deserializer and then they are shifted into the shift register across the CAM data inputs a byte at a time. For example, a byte of data 605 (i.e., 10001010) is input from the deserializer into a shift register connected to the CAM. This shift register and data input deserializer register may be one physical register when implemented in silicon.

The serial data is clocked in at about 622 megabits per second, while the byte data is clocked in at about 78 megabits per second, which is 622 megabits per second divided by 8 bits per byte.

The contents of CAM are used to detect the "F628" pattern. "Xs" are used to denote don't cares. The CAM has 8 rows and 28 columns of data, and the CAM is in a single match mode. When the incoming bit pattern matches the data in one of the rows the corresponding match flag will become 1 to indicate a match. In this figure, there is no match, so all match flags, one for each row in the CAM, are 0. Table 5 shows the CAM contents. Note that if we have a CAM sized larger in silicon than the required number of rows to match the possible positions of the pattern, then we would fill the remaining rows with "U" where "U" means "Never Match". If we instead filled the unused rows with all "X", we would have multiple matches on all the unused rows which would violate the requirements for a single match mode CAM.

deserializer. The A1A2 bytes are not byte aligned. The F62 sequence is fully in the register connected to the CAM, but the 8 is not yet fully in the register.

Figure 9:
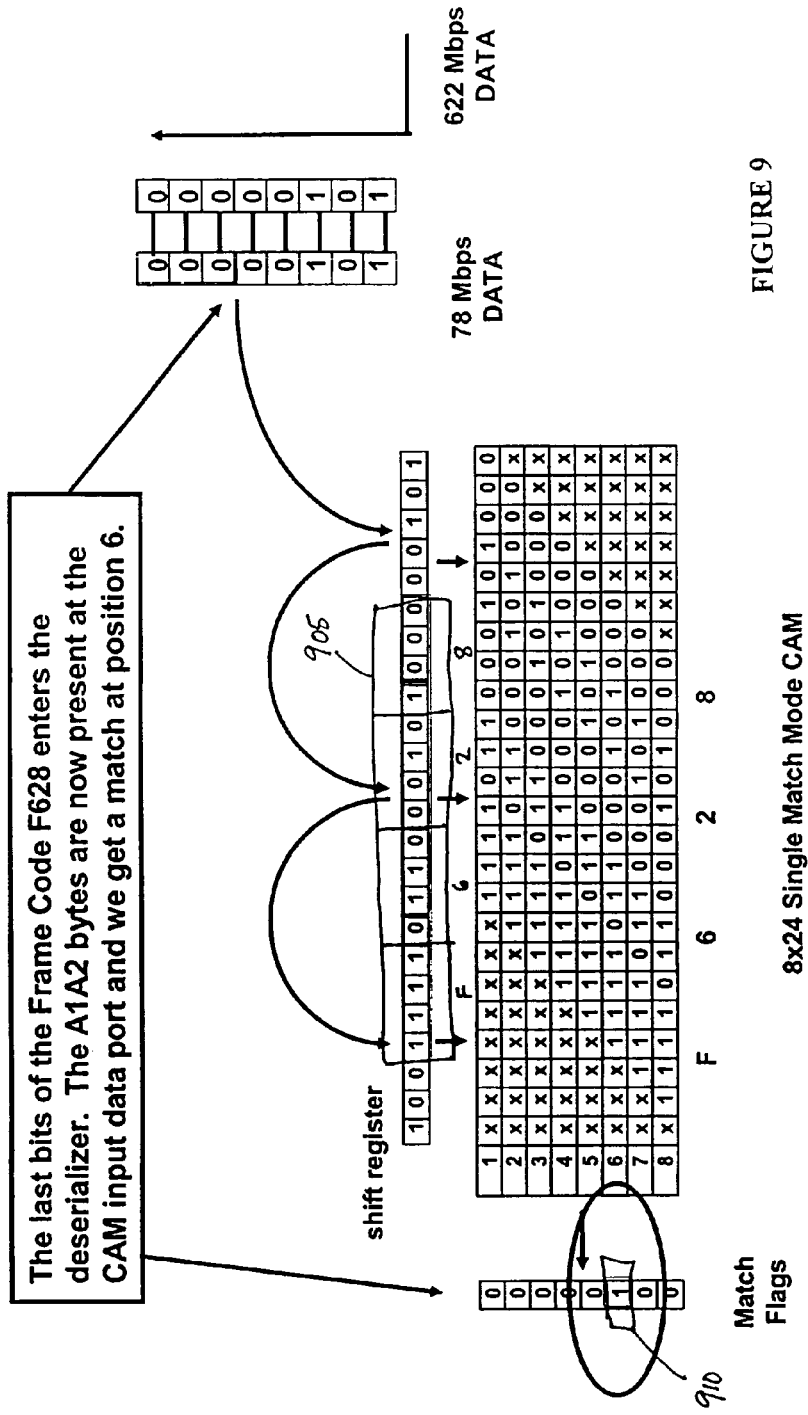
FIG. 9 shows the last bits of the frame code F628 entering the deserializer.

FIG. 9 shows the last bits of the frame code F628 entering the deserializer. The A1A2 bytes (indicated by box 905) are now present at the CAM input data port and we get a match at position 6 (indicated by box 910).

Figure 10:
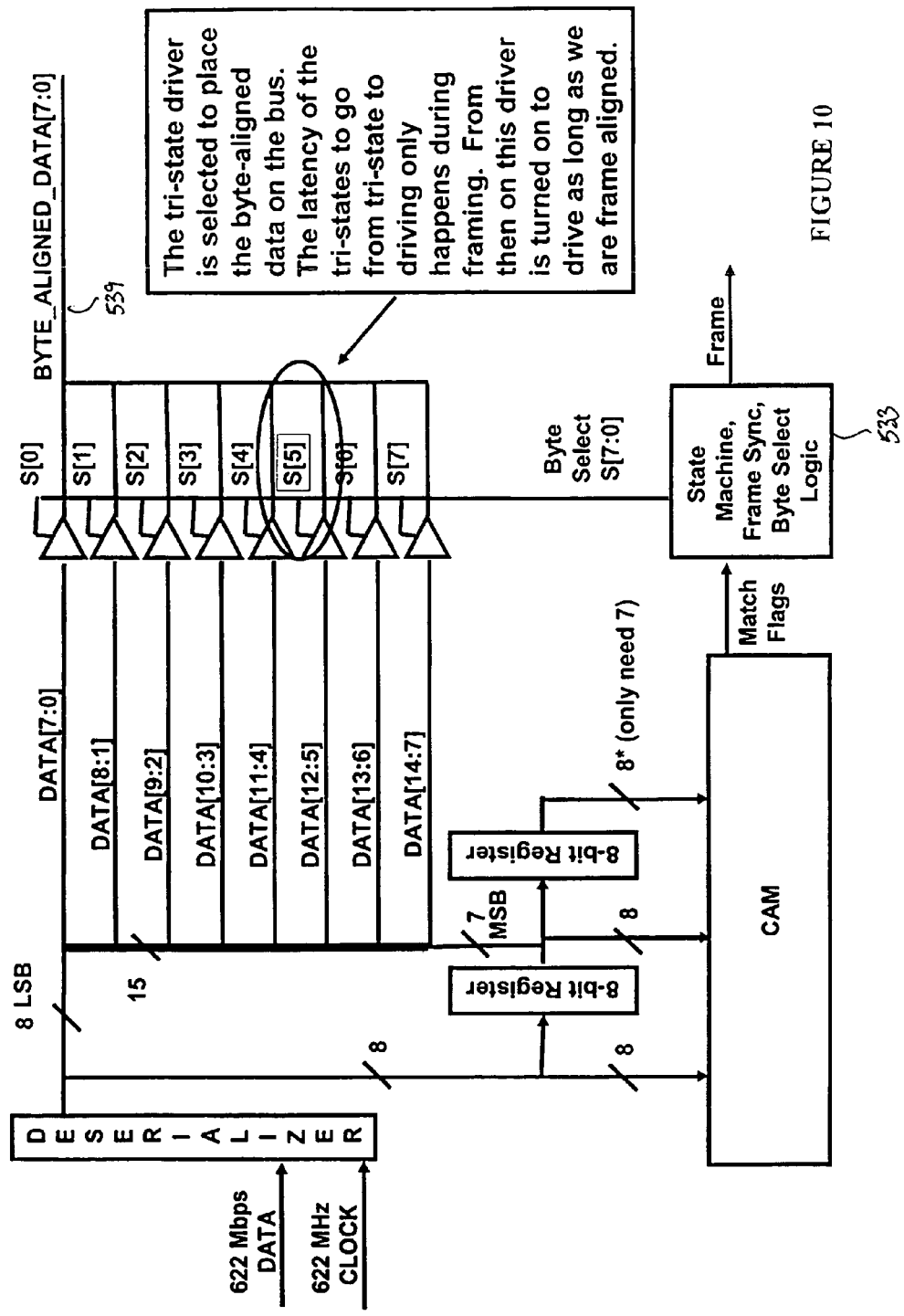
FIG. 10 shows the circuitry after a match flag 6 indicates a match.

FIG. 10 shows the circuitry after a match flag 6 indicates a match. The tristate driver is selected to place the byte-aligned data on the bus. The latency of the tristates to go from tristate to driving only happens during framing. From then on this driver is turned on to drive as long as we are frame aligned. The state machine 533 provides the S[5] signal to enable its tristate buffer, and the other S signals to disable their tristate buffers. DATA[12:5] is output through tristate buffer at 539 as byte aligned data.

Figure 11:
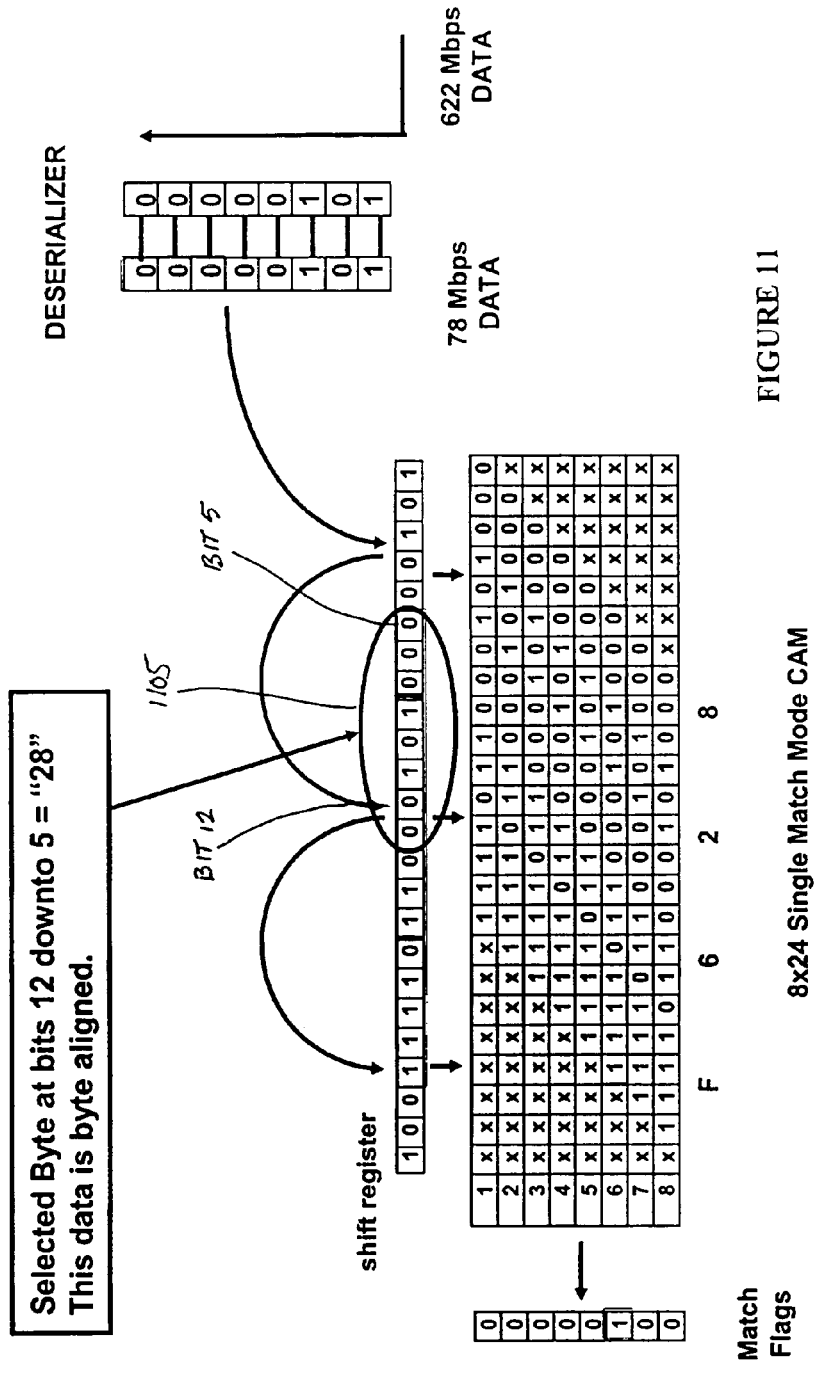
FIG. 11 shows the 8-bit bus data is byte aligned.

FIG. 11 shows the 8-bit frame data is byte aligned. The selected byte 1105 at bits 12 down to 5 is "28." This data is byte aligned.

The serial-to-parallel bus can be 8 bits, 10 bits, 16 bits, 20 bits, or another bit width. The circuitry may be adjusted to be able to operate with any one of these bus configurations.

Figure 12:
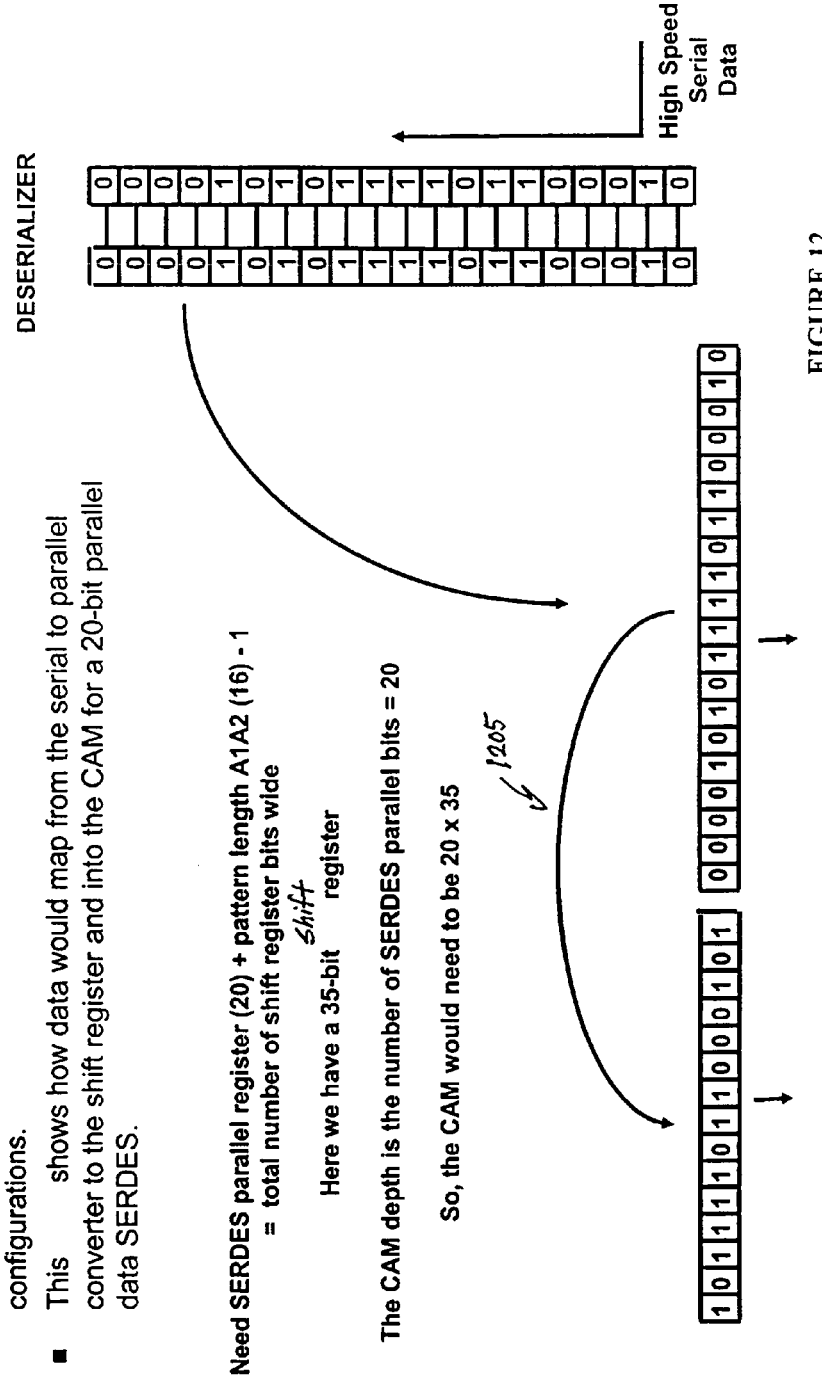
FIG. 12 shows a circuit implementation for a 20-bit bus width.

FIGS. 5 through 11 showed an example where the bus width is 8 bits. FIG. 12 shows a circuit implementation for a 20-bit parallel byte or word size (or bus width). This figure shows how data would map from the serial to parallel converter to the shift register and into the CAM for a 20-bit parallel data SERDES.

For this example, the total number of shift register bits wide is given by the SERDES parallel register width (i.e., 20 bits) plus the pattern length A1A2 (i.e., 16 bits) minus 1. Then the total number of bits for the shift register width will be 35 bits. The CAM depth is the number of SERDES parallel bits, which is 20. So, the CAM size should be 20 entries or rows deep by 35 bits wide. FIG. 12 shows a 35-bit wide shift register 1205.

Figure 13:
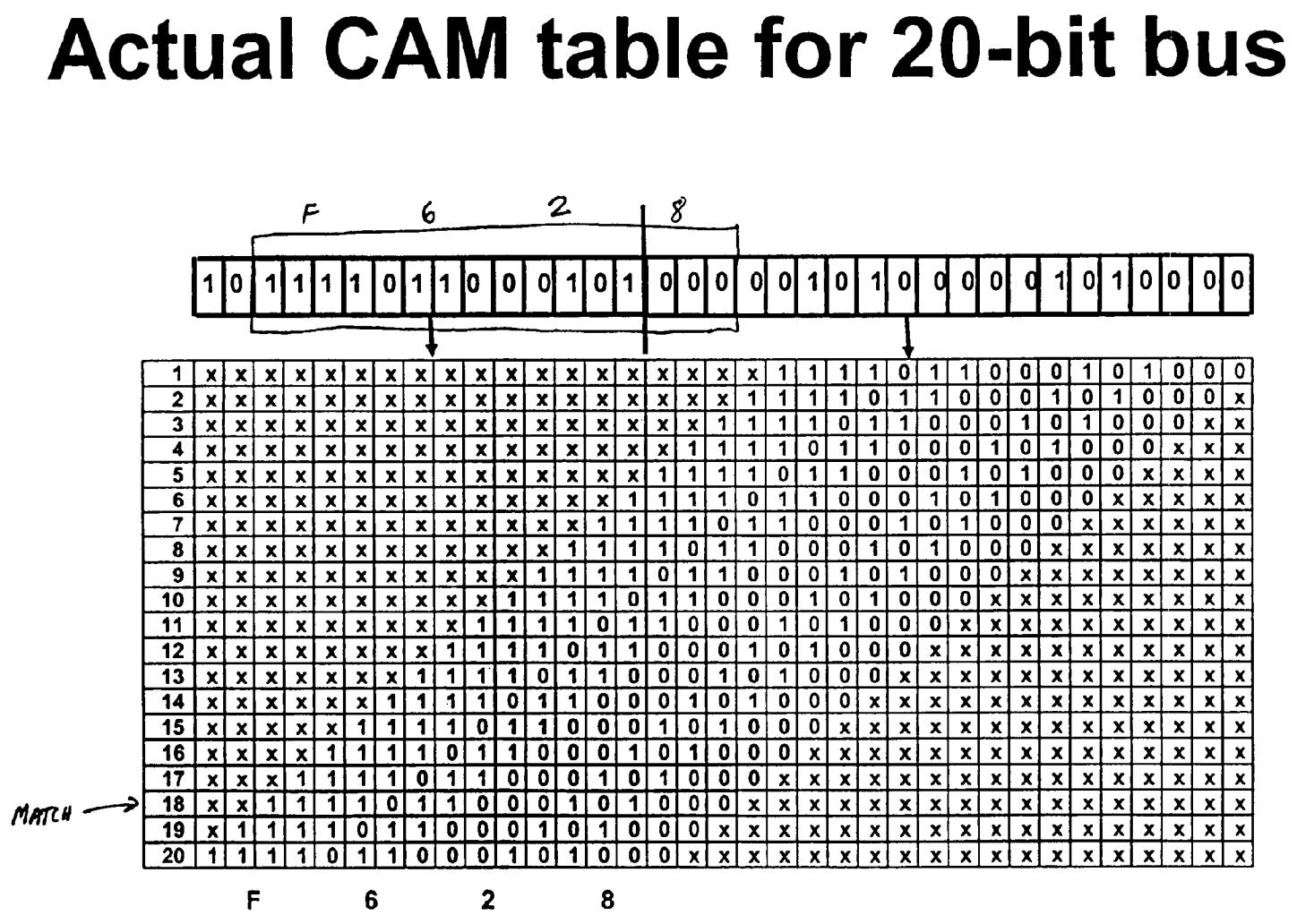

FIG. 13 shows an example of the contents of the CAM for detecting the A1A2(F628) pattern for a 20 bit frame size. The CAM is 20 rows deep by 35 bits wide. For this example, there is a match between F628 in the register and row 18. The circuitry for byte aligning 20-bit wide frame data using this CAM is similar to that described above for 8-bit wide frame data shown in FIGS. 5 through 11.

TABLE 1

| 1 | x | x | x | x | x | x | x | x | 1 | 1 | 1 | 1 | 0 | 1 | 1 | 0 | 0 | 0 | 1 | 0 | 1 | 0 | 0 | 0 |
|---|---|---|---|---|---|---|---|---|---|---|---|---|---|---|---|---|---|---|---|---|---|---|---|---|
| 2 | x | x | x | x | x | x | x | 1 | 1 | 1 | 1 | 0 | 1 | 1 | 0 | 0 | 0 | 1 | 0 | 1 | 0 | 0 | 0 | x |
| 3 | x | x | x | x | x | x | 1 | 1 | 1 | 1 | 0 | 1 | 1 | 0 | 0 | 0 | 1 | 0 | 1 | 0 | 0 | 0 | x | x |
| 4 | x | x | x | x | x | 1 | 1 | 1 | 1 | 0 | 1 | 1 | 0 | 0 | 0 | 1 | 0 | 1 | 0 | 0 | 0 | x | x | x |
| 5 | x | x | x | x | 1 | 1 | 1 | 1 | 0 | 1 | 1 | 0 | 0 | 0 | 1 | 0 | 1 | 0 | 0 | 0 | x | x | x | x |
| 6 | x | x | x | 1 | 1 | 1 | 1 | 0 | 1 | 1 | 0 | 0 | 0 | 1 | 0 | 1 | 0 | 0 | 0 | x | x | x | x | x |
| 7 | x | x | 1 | 1 | 1 | 1 | 0 | 1 | 1 | 0 | 0 | 0 | 1 | 0 | 1 | 0 | 0 | 0 | x | x | x | x | x | x |
| 8 | x | 1 | 1 | 1 | 1 | 0 | 1 | 1 | 0 | 0 | 0 | 1 | 0 | 1 | 0 | 0 | 0 | x | x | x | x | x | x | x |

Table 1 provides a CAM Table to detect A1A2 (F628) framing pattern for an 8-bit bus width.

Figure 7:
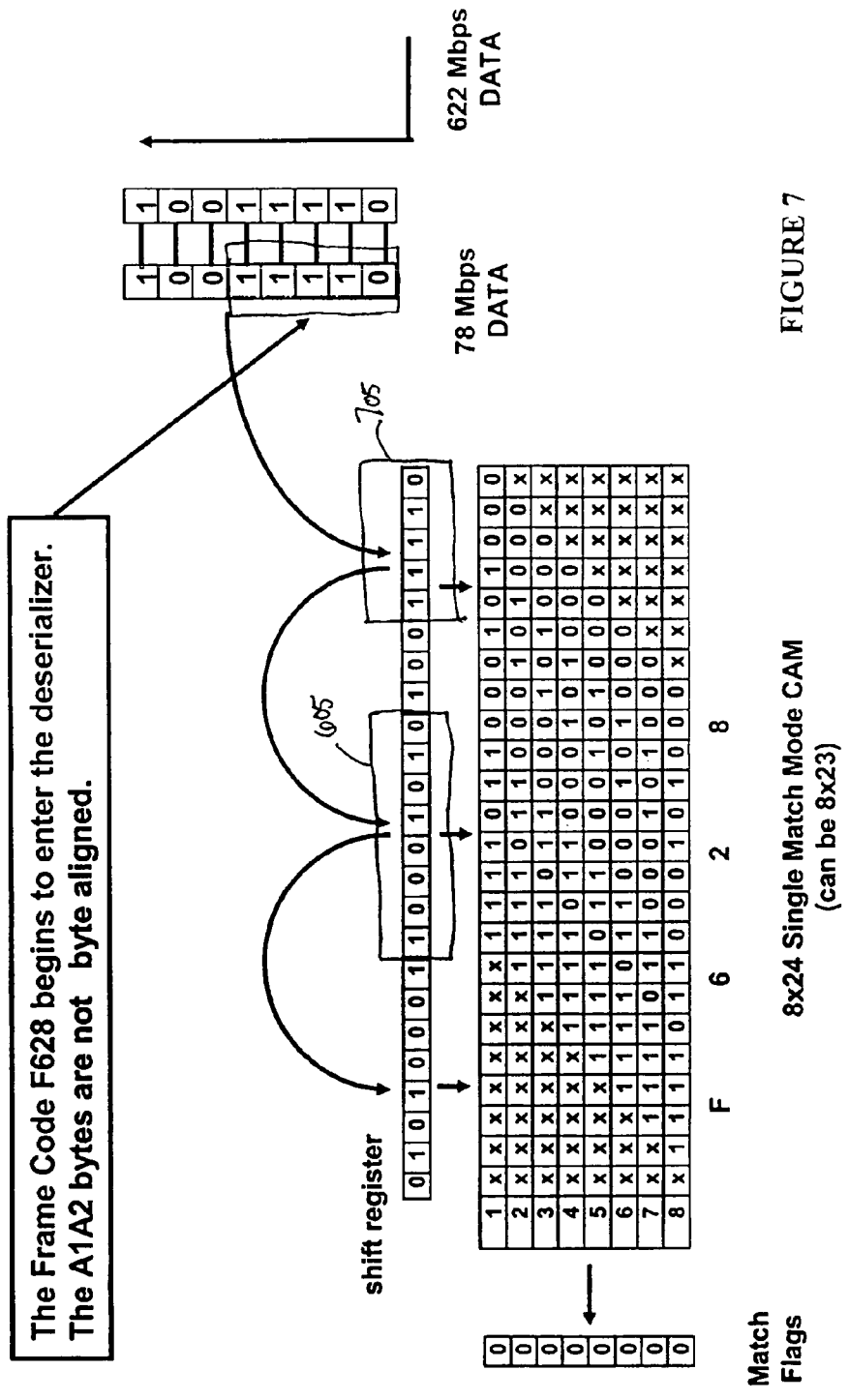
FIG. 7 shows the SONET frame code F628 beginning to enter the deserializer.

FIG. 7 shows the frame code F628 beginning to enter the deserializer. This figure shows the state of the circuitry at a time succeeding the previous figure. The A1A2 bytes are not byte aligned. There is still no match and all match flags are 0. Byte 605 from FIG. 6 is shifted into the first shift register (shift register 516 of FIG. 5). The first bits of the F6 sequence begin being placed into the register connected to the CAM.

Figure 8:
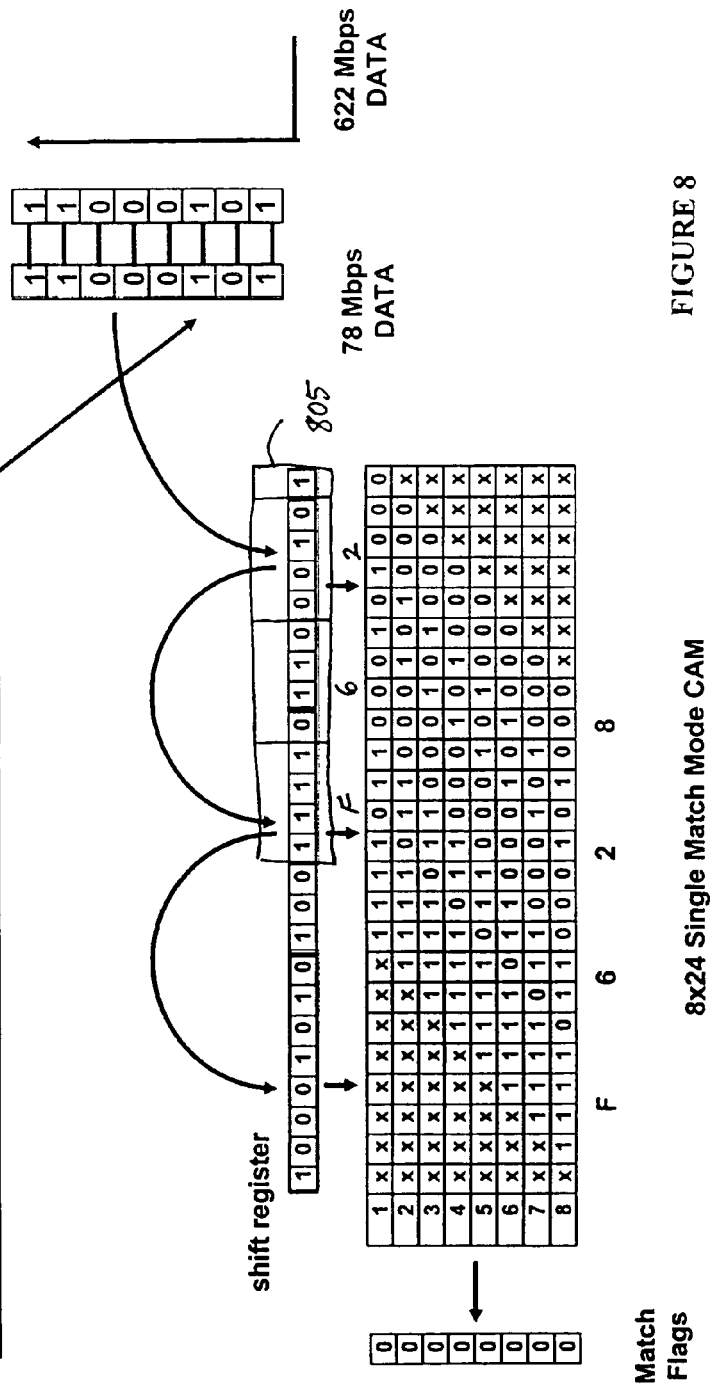
FIG. 8 shows the circuitry at a time period after the frame code F628 enters the deserializer.
Figure 14:
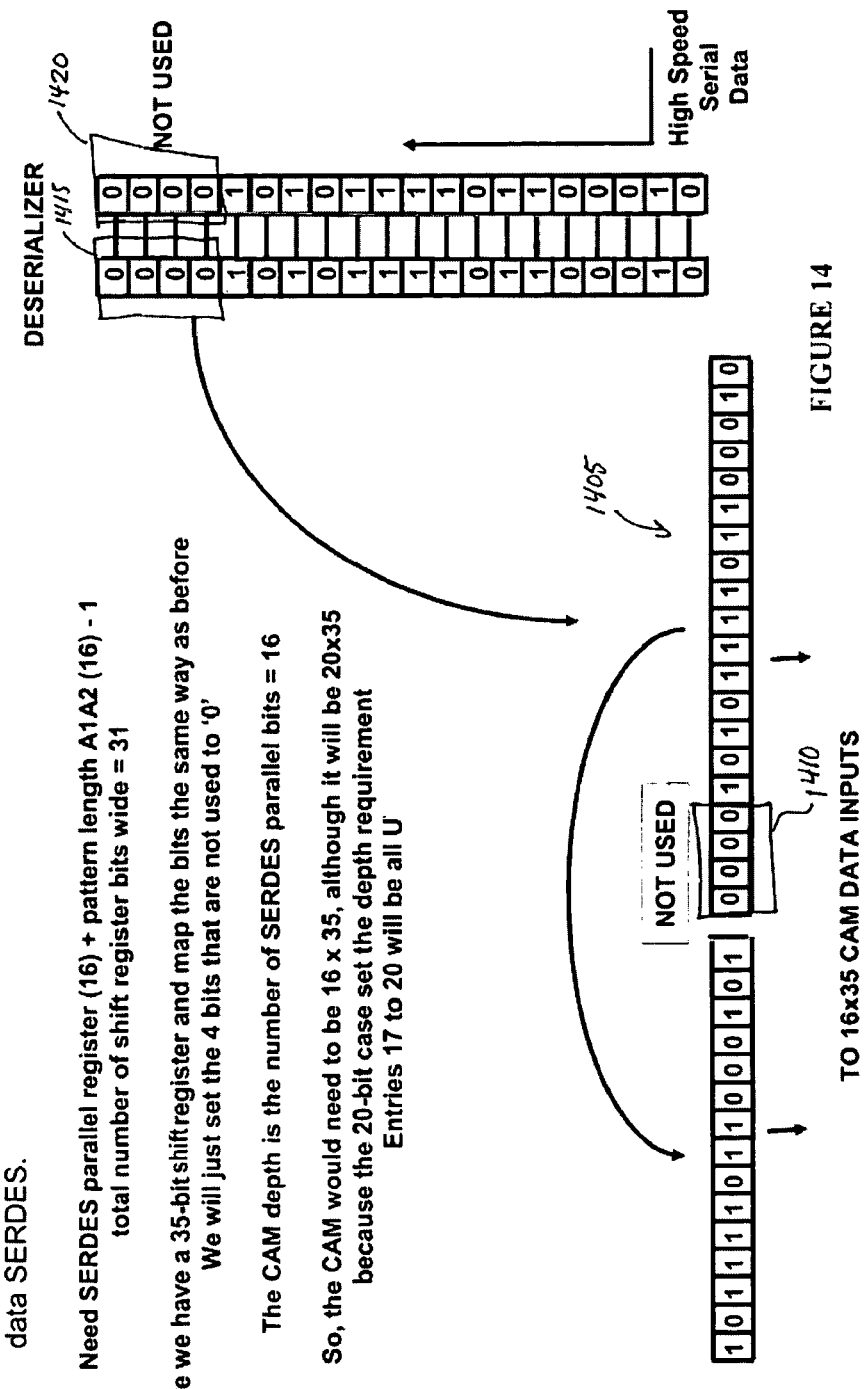
FIG. 14 shows a circuit implementation for a 16-bit bus width).

FIG. 8 shows the circuitry at a time period after the previous figure. The frame code F628 begins to enter the FIG. 14 shows a circuit implementation for a 16-bit frame size (or bit width). This shows how data would map from the serial to parallel converter to the shift register and into the CAM for a 16-bit parallel data SERDES.

The total number of shift register bits wide is given by the SERDES parallel register width (i.e., 16 bits) plus the pattern length A1A2 (i.e., 16 bits) minus 1. Then the total number of bits for the shift register width will be 31 bits.

Here we have a 35-bit shift register 1405 and map the bits the same way as before. We will just set the 4 bits 1410 that are not used to "0." This corresponds to bits 1415 in the deserializer and 1420 of the high speed serial data.

The CAM depth is the number of SERDES parallel bits, which is 16. So, the CAM size should be 16 entries or rows deep by 35 bits wide. However, as discussed above for a 20 bit parallel bus width, 20 rows are already made available in the CAM in order to handle the 20 bit bus width. Therefore, in an embodiment, we can reuse this same CAM to handle the 16-bit case. Then for the CAM, entries 17 to 20 will be "U"s.

Figure 15:
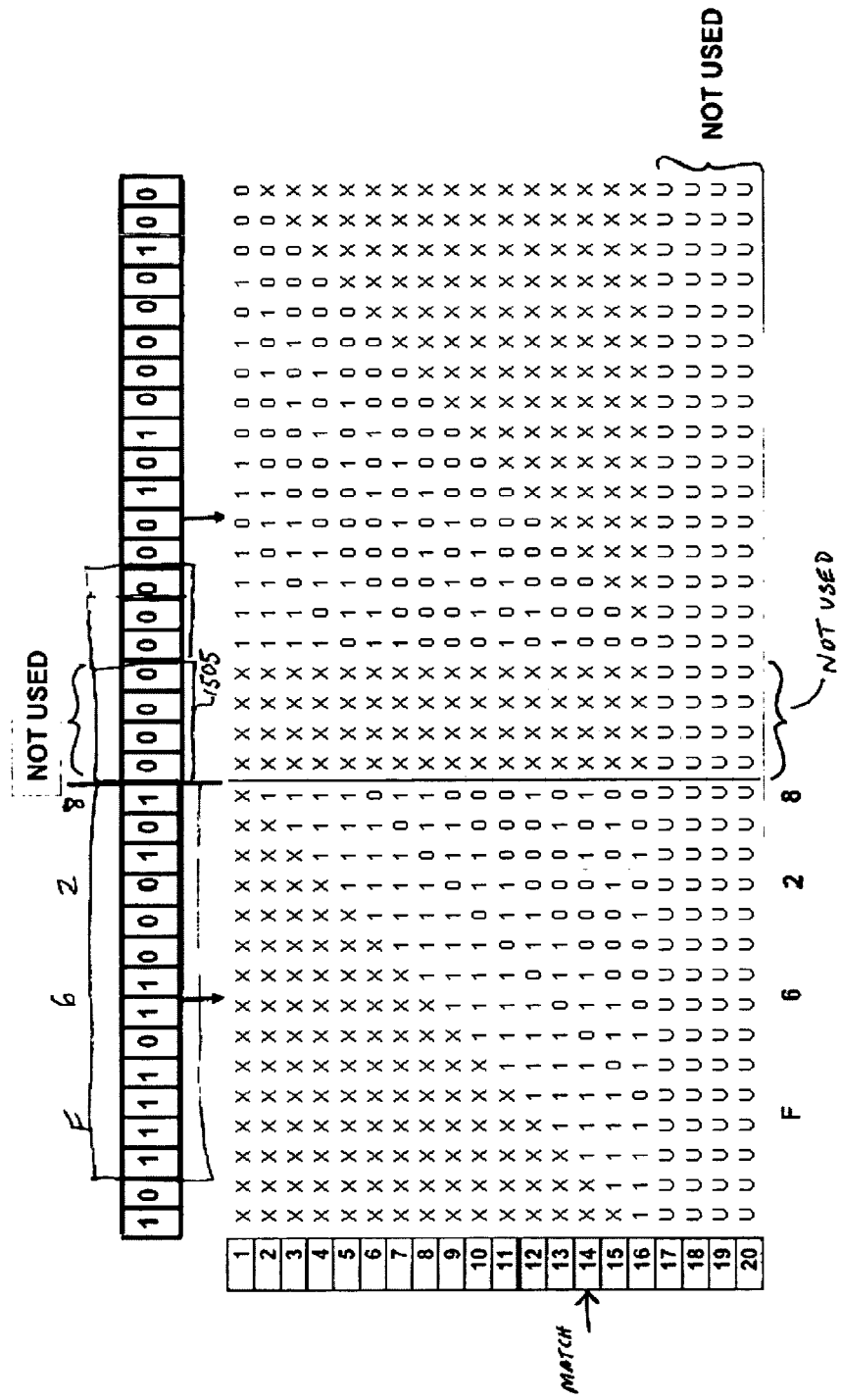
FIG. 15 shows an example of the contents of the CAM for detecting the A1A2(F628) pattern for a 16-bit bus width.

FIG. 15 shows an example of the contents of the CAM for detecting the A1A2(F628) pattern for a 16-bit bus size. There are many other possible contents of the CAM to detect a particular pattern, and any of these may be used.

The CAM is 20 rows deep by 35 bits wide. However, some of the bits 1505 in the shift register are not used. Rows 17 to 20 of the CAM are Us. Four columns in the CAM corresponding to the "not used" bits are also Xs. For this example, there is a match between F628 in the register and row 14. The circuitry for byte aligning 16-bit wide parallel data using this CAM is similar to that described above for 8-bit wide data shown in FIGS. 5 through 11.

The embodiment in this figure shows using a CAM that is larger than needed for the 16-bit parallel bus size because the same CAM is used to handle the 20-bit bus size. Depending on what the user selects, this CAM will be able to handle a 20-bit, 16-bit, 10-bit (see below), or 8-bit parallel bus size. Therefore, in an embodiment where only a 16-bit bus size or smaller will be made available, the CAM size could be 16 rows deep by 31 bits wide.

FIG. 16 shows a circuit implementation for a 10-bit bus size. This shows how data would map from the serial to parallel converter to the shift register and into the CAM for a 10-bit parallel data SERDES.

For the figure, the assumption is that the CAM size has already been set by the 20-bit bus width case and so the muxes as shown for the 10-bit bus width case are used. Alternatively, we could have increased the size of the CAM to eliminate the need for the muxes.

The total number of shift register bits wide is given by the SERDES parallel register width (i.e., 10 bits) plus the pattern length A1A2 (i.e., 16 bits) minus 1. Then the total number of bits required for the shift register width will be 25 bits.

Here we have a 35-bit shift register 1605 and map the bits a little differently than discussed above. We will just set the 10 bits 1610 that are not used to "0" and use two 2-to-1 bus multiplexers 1612 and 1613 to shift the data. The first 20-bit shift register is now configured as two virtual 10-bit shift registers. The unused 10 bits 1610 correspond to bits 1615 in the deserializer and 1620 of the high speed serial data.

This implementation permits a user to select between handling a 20-bit, 16-bit, 10-bit, or 8-bit parallel bus size using the same circuitry. If 10-bit size data will only be considered, the registers and CAM may be made smaller, and multiplexers may be omitted. However, in a FIG. 16 circuitry, this implementation uses multiplexers to form three stages of registers and unused bits out of the 35-bit shift register. The multiplexers are 2-to-1 bus multiplexers, where one selection input (e.g., input A) of the multiplexers will handle the 20- or 16-bit mode and the other selection input (e.g., input B) will handle the 10- or 8-bit mode.

The CAM depth is the number of SERDES parallel bits, which is 10. So, the CAM size should be 10 entries or rows deep by 35 bits wide. However, as discussed above for a 20 bit frame size, 20 rows are already made available in the CAM in order to handle the 20-bit frame size. Therefore, in an embodiment, we can reuse this same CAM as used in other embodiments to handle the 10-bit case. Then for the CAM, entries 11 to 20 will be "U"s.

Figure 17:
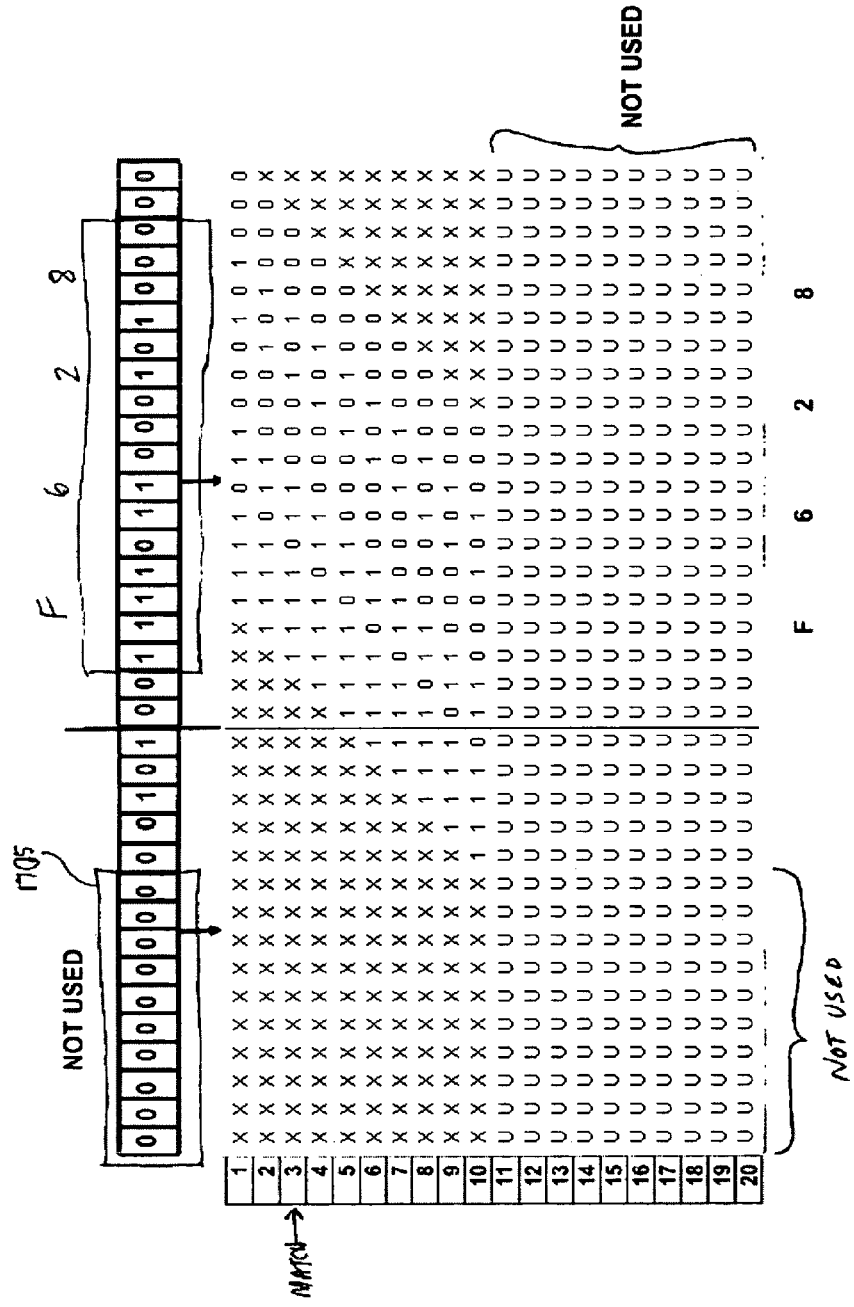
FIG. 17 shows an example of the contents of the CAM for detecting the A1A2(F628) pattern for a 10-bit bus width.

FIG. 17 shows an example of the contents of the CAM for detecting the A1A2(F628) pattern for a 10-bit bus size. There are many other possible contents of the CAM to detect a particular pattern, and any of these may be used.

The CAM is 20 rows deep by 35 bits wide. However, some of the bits 1705 in the shift register are not used. Rows 11 to 20 of the CAM are Us. Ten columns in the CAM corresponding to the "not used" bits are also Xs. For this example, there is a match between F628 in the register and row 3. The circuitry for byte aligning 10-bit wide bus data using this CAM is similar to that described above for 8-bit wide bus data shown in FIGS. 5 through 11.

The embodiment in this figure shows using a CAM that is larger than needed for the 10-bit frame size because the same CAM is used to handle the 20-bit parallel bus size. Depending on what the user selects, this CAM will be able to handle a 20-bit, 16-bit, 10-bit (see below), or 8-bit bus size. Therefore, in an embodiment where only a 10-bit bus size or smaller will be made available, the CAM size could be 10 rows deep by 25 bits wide.

Figure 18:
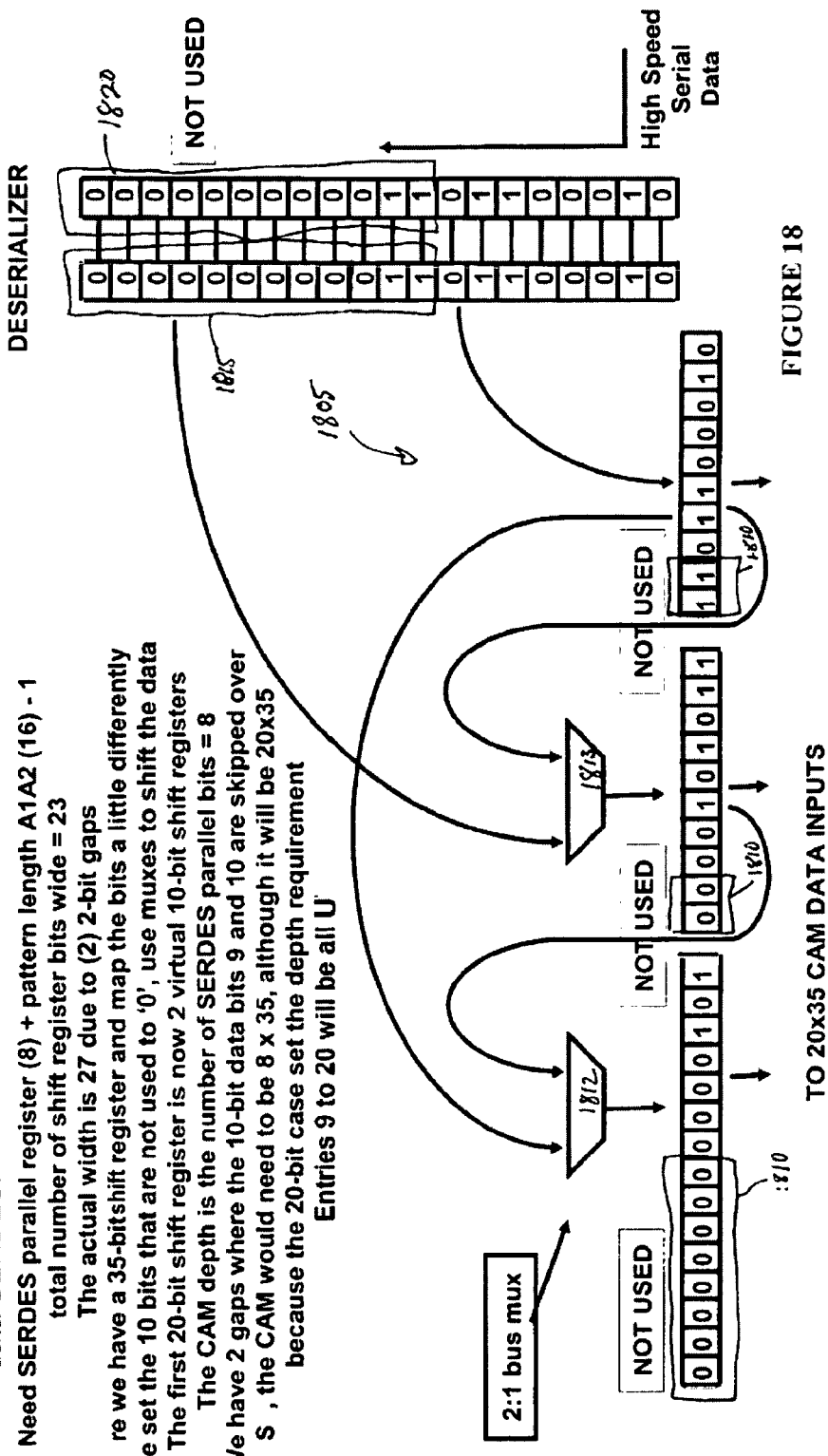
FIG. 18 shows a circuit implementation for a 8-bit bus width.

FIG. 18 shows a circuit implementation for a 8-bit bus size. This shows how data would map from the serial to parallel converter to the shift register and into the CAM for a 8-bit parallel data SERDES.

The total number of shift register bits wide is given by the SERDES parallel register width (i.e., 8 bits) plus the pattern length A1A2 (i.e., 16 bits) minus 1. Then the total number of bits required for the shift register width will be 23 bits. The actual width will be 27 due to two 2-bit gaps.

Here we have a 35-bit shift register 1805 and map the bits a little differently. We will just set the 10 bits 1810 (which are not consecutive bits in this case) that are not used to "0" or "1" and use two 2-to-1 bus multiplexers 1812 and 1813 to shift the data. The first 20-bit shift register is now configured as two virtual 10-bit shift registers. The unused 10 bits 1810 correspond to bits 1815 in the deserializer and 1820 of the high speed serial data.

This implementation permits a user to select between handling a 20-bit, 16-bit, 10-bit, or 8-bit bus size using the same circuitry. If 8-bit size data will only be considered, the registers and CAM may be made smaller, and multiplexers may be omitted. However, in a FIG. 18 circuitry, this implementation uses multiplexers to form three stages of registers and unused bits out of the 35-bit shift register. The multiplexers are 2-to-1 bus multiplexers, where one selection input (e.g., input A) of the multiplexers will handle the 20- or 16-bit mode and the other selection input (e.g., input B) will handle the 10- or 8-bit mode.

The CAM depth is the number of SERDES parallel bits, which is 8. So, the CAM size should be 8 entries or rows deep by 35 bits wide. However, as discussed above for a 20-bit bus size, 20 rows are already made available in the CAM in order to handle the 20-bit bus size. Therefore, in an embodiment, we can reuse this same CAM as used in other embodiments to handle the 8-bit case. Then for the CAM, entries 9 to 20 will be "U"s.

Figure 19:
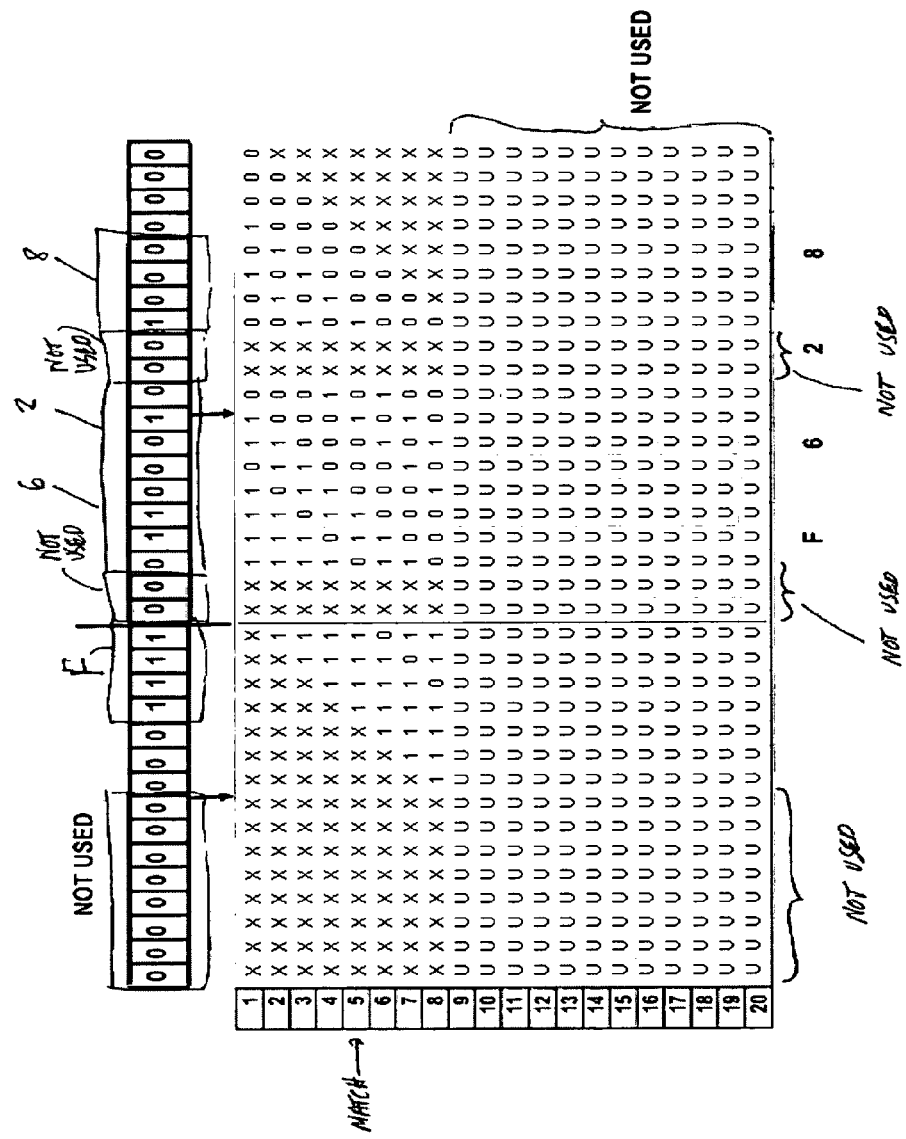
FIG. 19 shows an example of the contents of the CAM for detecting the A1A2(F628) pattern for a 8-bit bus width.

FIG. 19 shows an example of the contents of the CAM for detecting the A1A2 (F628) pattern for a 8-bit bus size. There are many other possible contents of the CAM to detect a particular pattern, and any of these may be used.

The CAM is 20 rows deep by 35 bits wide. However, some of the bits 1705 in the shift register are not used. Rows 9 to 20 of the CAM are Us. Twelve columns in the CAM corresponding to the "not used" bits are also Xs. For this example, there is a match between F628 in the register and row 5. The circuitry for byte aligning 8-bit wide bus data using this CAM is similar to that described above for 8-bit wide frame data shown in FIGS. 5 through 11.

The embodiment in this figure shows using a CAM that is larger than needed for the 8-bit bus size because the same CAM is used to handle the 20-bit bus size. Depending on what the user selects, this CAM will be able to handle a 20-bit, 16-bit, 10-bit (see below), or 8-bit bus size. Therefore, in an embodiment where only a 8-bit bus size or smaller will be made available, the CAM size could be 8 rows deep by 23 bits wide.

The embodiments in this patent have described detecting the "F628" pattern as an example. The technique of the invention may also be applied to any other pattern a user would like to detect by making appropriate changes to the CAM. For example, the invention may be used to detect the comma detect of the Ethernet protocol.

FIG. 20 shows an example of the contents of the CAM for detecting A1A1A2A2(F6F62828) for a 20-bit bus width. Shown are an array of rows and columns of the contents of the CAM. When matching a SONET framing pattern F6F62828, the state machine would look for two consecutive matches in the top half of the table followed by two corresponding consecutive matches in the bottom half of the table.

FIG. 21 shows an example of the contents of the CAM for detecting A1A1A2A2(F6F62828) for a 16-bit bus width. Shown are an array of rows and columns of the contents of the CAM. When matching a SONET framing pattern F6F62828, the state machine would look for two consecutive matches in the top half of the table followed by two corresponding consecutive matches in the bottom half of the table.

FIG. 22 shows an example of the contents of the CAM for detecting A1A1A2A2(F6F62828) for a 10-bit bus width. Shown are an array of rows and columns of the contents of the CAM. When matching a SONET framing pattern F6F62828, the state machine would look for two consecutive matches in the top half of the table followed by two corresponding consecutive matches in the bottom half of the table.

FIG. 23 shows an example of the contents of the CAM for detecting A1A1A2A2(F6F62828) for an 8-bit bus width. Shown are an array of rows and columns of the contents of the CAM. When matching a SONET framing pattern F6F62828, the state machine would look for two consecutive matches in the top half of the table followed by two corresponding consecutive matches in the bottom half of the table.

FIG. 24 shows an example of detecting the comma character K28.5− (negative disparity) and K28.5+ (positive disparity) for a 20-bit bus width. Shown are an array of rows and columns of the contents of the CAM. K28.5 and K28− are comma characters. This example shows the flexibility of the technique of the invention and detecting characters other than the ones previously described. The technique of the invention may be used to detect other characters similar by making changes to the contents of the CAM. In an embodiment of the invention, the changes may be made dynamically, so the same CAM may be used to process and detect different characters in a bitstream by changing the contents of the CAM during processing, or during a pause in the processing. This permits more flexibility in the design of a system using a technique of the invention, since the same system can be used to detect different characters. This also permits use the same system design to detect different characters for interfacing with different systems, or permits updates and compatibility as technology improves. The contents of the CAM may be provided or stored using nonvolatile storage, magnetic storage, optical storage, FLASH storage, transferred wirelessly, transferred through a network such as the internet, and others.

FIG. 25 shows an example of detecting K28.5− and K28.5+ for a 10-bit bus width. Shown are an array of rows and columns of the contents of the CAM.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method comprising:
receiving a serial stream of data bits;
deserializing the serial stream of data bits into parallel bits;
inputting the parallel bits into a content addressable memory and a first register during a single clock cycle;
inputting an output of the first register into a second register;
inputting outputs of the first and second registers to the content addressable memory, wherein the parallel bits, output of the first register, and output of the second register are combined and stored as a first parallel word in a first row of the content addressable memory;
providing a bus configured to receive the parallel bits and output of the first register, wherein the data lines forming the bus are grouped into a plurality of overlapping subsets of the bus that each contain at least one common data line;
providing the parallel bits and the output of the first register in a plurality of parallel bit outputs onto the bus;
providing a set of parallel words stored in the content addressable memory, wherein at least one of the set of parallel words includes a fixed frame alignment detection pattern having a data position;
simultaneously comparing the first parallel word to the set of parallel words stored in the content addressable memory to detect a frame alignment pattern in the first parallel word; and
when the frame alignment pattern is detected in the first parallel word, selecting one of the subsets and associated parallel bit outputs based on match flag outputs from the content addressable memory, wherein each of the match flag outputs are associated with a respective one of the set of parallel words that includes the matching frame alignment pattern and the matching data position with respect to the frame alignment pattern of the first parallel word.

2. The method of claim 1 wherein the plurality of parallel bits and the output of the first register are input to a plurality of tristate driver circuits, and wherein selecting one of the subsets and the associated parallel bit outputs comprises:
enabling one of the tristate driver circuits to output the parallel bits and the output of the first register associated with that tristate driver circuit to an output bus, and disabling other ones of the tristate driver circuits coupled to the output bus.

3. The method of claim 1 wherein there are eight parallel bits.

4. The method of claim 1 wherein the first and second registers are two stages of a shift register.

5. The method of claim 1 wherein a depth of the content addressable memory comprises at least one row for each of the parallel bits.

6. The method of claim 1 wherein the inputs to the content addressable memory are provided by way of parallel transfer.

7. The method of claim 6 wherein a width of the parallel bits inputting the content addressable memory is at least a number of parallel bits output from the deserializer plus a length of a pattern to be detected using the content addressable memory minus 1.

8. A circuit comprising:
a deserializer circuit coupled to receive serial data input and outputting a first parallel data output, wherein the deserializer circuit outputs the first parallel data onto a bus that is configured with overlapping subsets of the bus, wherein the subsets include at least one common data line;
a shift register coupled to the first parallel data output; and
a content addressable memory, that is coupled to an output of the shift register and that receives the first parallel data output in parallel with the output of the shift register, wherein the output of the shift register is stored as part of a first parallel word in a first row of the content addressable memory that is simultaneously compared to a set of parallel words employed by the content addressable memory to detect a pattern within the first parallel word, wherein each parallel word of the set of parallel words includes a fixed data pattern to detect the pattern in the first parallel word, and wherein each fixed data pattern includes a respective data position within a respective data word.

9. The circuit of claim 8 further comprising:
a plurality of second parallel data outputs based on the first parallel data output, wherein each of second parallel data outputs are associated with a respective one of the subsets; and
a plurality of tristate buffer circuits, one coupled to each of the subsets of the bus.

10. The circuit of claim 9 further comprising:
a control logic block, coupled to a match signal from the content addressable memory, generating a plurality of select signals, one coupled to each of the tristate buffer circuits.

11. The circuit of claim 10 wherein based on the match signal, the control logic block generates select signals to enable one of the tristate buffers and disable others of the tristate buffers.

12. The circuit of claim 10 wherein the control logic block comprises a state machine.

13. The circuit of claim 9 wherein there is one parallel data output for each bit of the first parallel data output minus 1.

14. The circuit of claim 8 wherein the shift register is divided into three portions, the first portion of the shift register is coupled to the deserializer, the second portion of the shift register is coupled to the first portion through a first multiplexer, and the third portion of the shift register is coupled to the second portion through a second multiplexer.

15. The circuit of claim 14 wherein the third portion of the shift register is coupled to the first portion of the shift register through the second multiplexer.

16. The circuit of claim 14 wherein the second portion of the shift register is coupled to the deserializer through the first multiplexer.

17. The circuit of claim 8
wherein each row in the content addressable memory comprises a data pattern to be detected in the serial data input.

18. The circuit of claim 8 wherein the content addressable memory has a number of rows equal to or greater than a number of bits of the first parallel data output.

19. The circuit of claim 8 wherein the content addressable memory comprises a bit pattern comprising "1111," "0110," "0010," and "1000" in at least a number of rows that is equal to a number of bits of the first parallel data output.

20. The circuit of claim 8 wherein the first parallel data output is 8, 10, 16, or 20 bits wide.

21. A programmable logic integrated circuit comprising the circuit of claim 8.

22. The circuit of claim 8 further comprising:
a plurality of parallel data output formats based on the first parallel data output; and
a selector circuit, coupled to each of the parallel data output formats and the first parallel data output, outputting one of the parallel data output formats as a second parallel data output based on an output from the content addressable memory.

23. The circuit of claim 8 wherein the first parallel data output comprises 8 bits in a format bit 0, bit 1, bit 2, bit 3, bit 4, bit 5, bit 6, and bit 7, and the circuit further comprises:
a first parallel data output format comprising bit 1, bit 2, bit 3, bit 4, bit 5, bit 6, bit 7, and bit 0;
a second parallel data output format comprising bit 2, bit 3, bit 4, bit 5, bit 6, bit 7, bit 0, and bit 1; and
a third parallel data output format comprising bit 3, bit 4, bit 5, bit 6, bit 7, bit 0, bit 1 and bit 2;
a fourth parallel data output format comprising bit 4, bit 5, bit 6, bit 7, bit 0, bit 1, bit 2, and bit 3;
a fifth parallel data output format comprising bit 5, bit 6, bit 7, bit 0, bit 1, bit 2, bit 3, and bit 4;
a sixth parallel data output format comprising bit 6, bit 7, bit 0, bit 1, bit 2, bit 3, bit 4, and bit 5; and
a seventh parallel data output format comprising bit 7, bit 0, bit 1, bit 2, bit 3, bit 4, bit 5, and bit 6.

24. A method comprising:
deserializing an input serial data stream into a first parallel word;
storing the first parallel word in a register;
deserializing the input serial data stream into a second parallel word;
grouping the first parallel word and the second parallel word into a plurality of data word subsets that overlap to include at least one common data bit;
generating a third parallel word from the combination of the first parallel word and the second parallel word, wherein the third parallel word is wider than the first parallel word and the second parallel word;
storing the third parallel word in a first row of a content addressable memory;
detecting a frame alignment symbol within the third parallel word by simultaneously comparing the third parallel word to a plurality of fixed frame alignment patterns, wherein each of the fixed frame alignment patterns are part of a respective one of a set of parallel words stored in the content addressable memory, and wherein each fixed frame alignment pattern contains the alignment symbol to be detected at a different position.

25. The method of claim 24, further comprising selecting one of the subsets associated with a respective one of the frame alignment patterns that matches the frame alignment symbol.

26. The method of claim 24, wherein detecting the frame alignment symbol comprises detecting the frame alignment symbol within one clock cycle.

27. The method of claim 24, wherein grouping the second parallel word comprises outputting the second parallel word on a data bus that includes subsets of data lines that correspond to the data word subsets.

* * * * *